United States Patent
Matsui et al.

(10) Patent No.: US 7,638,786 B2
(45) Date of Patent: Dec. 29, 2009

(54) SEMICONDUCTOR AND SEMICONDUCTOR MANUFACTURING ARRANGEMENTS HAVING A CHALCOGENIDE LAYER FORMED OF COLUMNAR CRYSTAL GRAINS PERPENDICULAR TO A MAIN SUBSTRATE SURFACE

(75) Inventors: Yuichi Matsui, Kawasaki (JP); Motoyasu Terao, Hinode (JP); Norikatsu Takaura, Tokyo (JP); Takahiro Morikawa, Hachioji (JP); Naoki Yamamoto, Kochi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/272,811

(22) Filed: Nov. 15, 2005

(65) Prior Publication Data

US 2006/0105556 A1 May 18, 2006

(30) Foreign Application Priority Data

Nov. 15, 2004 (JP) ............................. 2004-330537
Jan. 18, 2005 (JP) ............................. 2005-010199

(51) Int. Cl.
*H01L 29/02* (2006.01)

(52) U.S. Cl. .......................... 257/2; 438/102; 438/103; 257/E29.002; 365/163

(58) Field of Classification Search ................ 257/1–5, 257/E29.002; 438/800, 900, 102–103; 365/163
See application file for complete search history.

(56) References Cited

U.S. PATENT DOCUMENTS 5,714,768 A 2/1998 Ovshinsky et al.

5,825,046 A 10/1998 Czubatyj et al.
2003/0067013 A1 * 4/2003 Ichihara et al. ............. 257/200

FOREIGN PATENT DOCUMENTS

JP 11-514150 11/1999

(Continued)

OTHER PUBLICATIONS

"Crystallographic Data on Minerals" in CRC Handbook of Chemistry and Physics, Internet Version 2007, (87th edition), David R. Lide, ed., Taylor and Francis, Boca Raton FL.*

(Continued)

*Primary Examiner*—Thanh V Pham
*Assistant Examiner*—Jami M Valentine
(74) *Attorney, Agent, or Firm*—Antonelli, Terry, Stout & Kraus, LLP.

(57) ABSTRACT

The annealing process at 400° C. or more required for the wiring process for a phase change memory has posed the problem in that the crystal grains in a chalcogenide material grow in an oblique direction to cause voids in a storage layer. The voids, in turn, cause peeling due to a decrease in adhesion, variations in resistance due to improper contact with a plug, and other undesirable events. After the chalcogenide material has been formed in an amorphous phase, post-annealing is conducted to form a (111)-oriented and columnarly structured face-centered cubic. This is further followed by high-temperature annealing to form a columnar, hexagonal closest-packed crystal. Use of this procedure makes it possible to suppress the growth of inclined crystal grains that causes voids, since crystal grains are formed in a direction perpendicular to the surface of an associated substrate.

19 Claims, 28 Drawing Sheets

FOREIGN PATENT DOCUMENTS

JP          2001-502848          2/2001

OTHER PUBLICATIONS

"oblique" Merriam-Webster Online Dictionary. 2007, http://www.merriam-webster.com (Sep. 13, 2007).*

Technical Digest of International Electron Devices Meeting pp. 803-806.

Journal of Applied Physics, vol. 87, Issue No. 9, p. 4130, May 2000.

S, Hosaka, K. Miyauchi, T. Tamura, Y. Yin, and H. Sone: Proposal of memory transistor using a phase change and nano-size effects for high density memory array, Proc. Of PCOS2003, Shizuoka, Japan, pp. 52-55, 2003.

F. Pellizzer et al. 2004 Symposium on VLSI Technology Digest of Technical Papers, IEEE, 2004, pp. 18-19.

* cited by examiner

SEMICONDUCTOR AND SEMICONDUCTOR MANUFACTURING ARRANGEMENTS HAVING A CHALCOGENIDE LAYER FORMED OF COLUMNAR CRYSTAL GRAINS PERPENDICULAR TO A MAIN SUBSTRATE SURFACE

CLAIM OF PRIORITY

The present application claims priority from Japanese application JP 2004-330537, filed on Nov. 15, 2004, and Japanese application JP 2005-010199, filed on Jan. 18, 2005, the contents of which are hereby incorporated by reference into this application.

BACKGROUND OF THE INVENTION

1. Field of the Invention

The present invention relates to a technique applied to and effective for a semiconductor device having a phase change memory cell formed using a phase change material such as chalcogenide.

2. Description of the Related Arts

Mobile devices represented by hand-held phones use a semiconductor memory such as a DRAM, SRAM, or flash memory. Although large in capacity, DRAMs are low in access speed. Conversely, SRAMs are high in access speed, whereas they are unsuitable for use as a large-capacity memory, since they require as many as four to six transistors per cell and are therefore difficult to integrate with high density.

Also, DRAMs and SRAMs require constantly continued electrical energization for data retention. In other words, both are volatile. Flash memories, however, are nonvolatile, so although they require no electrical energization for memory retention, memories of this type have drawbacks in that the maximum permissible number of their rewriting/erasing operations is limited to about $10^5$ times and in that their rewriting speeds are several orders-of-magnitude lower than other memories. As described above, the three types of memories have the respective advantages and disadvantages, and currently, each type of memory is selectively used according to the particular features and characteristics of the memory.

If a universal memory is realized that combines the advantages of a DRAM, an SRAM, and a flash memory each, it is possible to integrate plural types of memories into one chip and thus to implement the miniaturization and functional sophistication of hand-held phones and other various mobile devices.

Additionally, there will be very significant impacts if all types of semiconductor memories become replaceable with a single type of memory. The requirements of a universal memory include: (1) an integration density (large capacity) comparable to that of a DRAM, (2) an access (read/write) speed as high as that of an SRAM, (3) nonvolatility equivalent to that of a flash memory, and (4) electric power consumption low enough to withstand compact-battery driving.

A phase change memory is currently catching the most attention among all nonvolatile memories of the next generation, called the universal memories. The phase change memory employs the chalcogenide material used in a CD-RW, a DVD, or other optical disks, and similarly to these media, the phase change memory stores data by utilizing the differences in characteristics between the crystal state and amorphous state of the memory. These differences exist in read/write methods: whereas CD-RWs and DVDs utilize the transmission and reflection of the light represented by laser light, the phase change memory writes in data using the Joule heat generated by an electric current, and reads out data according to a particular resistance difference due to a change in phase.

The principles of operation of the phase change memory (an abbreviated name of a semiconductor storage device: hereinafter, the same) are described below with reference to FIG. 3. When a chalcogenide material is amorphized, such a reset pulse is applied that causes the chalcogenide material to be rapidly quenched after it is heated to a melting point (glass transition point Tg) or more. The melting point is, for example, 600° C. The rapid-quenching time (t1) required is, for example, 2 nsec. When the chalcogenide material is crystallized, such a set pulse is applied that retains the temperature of the chalcogenide material at a crystallization temperature or more, and less than a melting point. The crystallization point is, for example, 400° C. The time (t2) required for the crystallization is, for example, 50 nsec.

A feature of the phase change memory is that since the chalcogenide material, depending on its crystal state, changes in resistance value by no less than two to three orders of magnitude and this resistance value is used as a signal, a high reading signal level can be obtained and this facilitates sensing operation and allows high-speed reading. Also, this memory has $10^{12}$ repetition cycles of rewritability, and other performance characteristics compensating for the drawbacks of flash memories. In addition, features such as low-voltage/low-power operability and the ease in embedding with logic circuit elements make this memory suitable for use as a mobile device.

An example of manufacturing processes for the phase change memory will be briefly described below using FIGS. 4 to 6 which are sectional process diagrams of major constituent elements. First, with reference to FIG. 4, a well-known manufacturing method is used to form a select transistor on a semiconductor substrate not shown. The select transistor includes, for example, an MOS transistor and a bipolar transistor. Next, a well-known manufacturing method is used to deposit an interlayer dielectric film A11 made of, for example, a silicon oxide film, and then form a plug A12 made of, for example, tungsten, inside the interlayer dielectric film A11. This plug functions to electrically connect a lower select transistor and an upper phase-change layer. Then, a chalcogenide layer A13 made of, for example, a germanium-antimony-tellurium (GeSbTe) mixture or alloy, an upper electrode A14 made of, for example, tungsten, and a hard mask A15 made of, for example, a silicon oxide film, are deposited in that order. This state is shown in FIG. 4. The film thickness of the chalcogenide layer A13 depends on the specifications of the resistance value read out as a signal. However, the layer A13 is formed with a film thickness of 100 nm, for example.

Next, as shown in FIG. 5, the hard mask A15, the upper electrode A14, and the chalcogenide layer A13 are patterned using a well-known lithographic method and dry-etching method.

Next depositing an interlayer dielectric film A16 is deposited such a state as shown in FIG. 6. After that, an interconnection layer for electrical connection to the upper electrode A14 is formed at the upper section of the interlayer dielectric film A16, and a plurality of interconnection layers are further formed at the upper section of the above interconnection layer in order to complete the phase change memory (not shown). When these processes are finished, a phase change memory cell is approximately completed. Information associated with this type of phase change memory cell is disclosed in, for example, the "Technical Digest of International Electron Devices Meeting, pages 803-806 (2001)," and information on the phase changes of chalcogenide materials is disclosed in, for example, the "Journal of Applied Physics, Vol. 87, Issue No. 9, page 4130, May 2000."

Additionally, JP-A 11-514150 and JP-A 2001-502848 disclose the information given below. That is, in the phase change memories described in these Publications, a very small phase-change cell with an MOS transistor connected thereto is defined as a basic memory cell (one-bit), and information is recorded and erased by applying a pulse current to a phase change material and utilizing self-heating based on the resulting Joule heat. During the recording, the phase change material is crystallized by applying such a pulse current (set pulse) that heats the phase change material to a temperature region in which its rapid crystallization is achievable at a relatively low temperature. During the erasure, the phase change material is amorphized by applying such a pulse current (reset pulse) that causes the phase change material to be rapidly quenched after being heated to a high temperature. The phase change material has high electrical conductivity when in a crystal phase, and relatively low electrical conductivity when in an amorphous phase. During reading, a low voltage is applied to the phase change material and then the resulting electric current is converted into a voltage, whereby information is read.

The transistor reported by Mr. Hosaka et al. of Gunma University at the Symposium on Phase Changes, 2003, is known as a phase-change transistor (refer to (S, Hosaka, K. Miyauchi, T. Tamura, Y. Yin, and H. Sone: "Proposal of memory transistor using a phase change and nano-size effects for high density memory array; Proc. of PCOS2003, Shizuoka, Japan, pp. 52-55, 2003)). The crystallization of a chalcogenide film and the amorphization thereof causes the phase change memory to exhibit a memory action, and the same also applies to a phase change memory.

SUMMARY OF THE INVENTION

The phase change memory employs the chalcogenide material used in a CD-RW, a DVD, or other optical disks, and similarly to these media, the phase change memory stores data by utilizing the differences in characteristics between the crystal state and amorphous state of the memory. However, the heretofore unrevealed difficulty with temperature control during manufacturing processes is surfacing as a problem since a manufacturing method differs between optical disks and semiconductor memories.

In traditional manufacturing processes, the crystallization of a chalcogenide film which is an information-retaining section (memory) is performed during deposition by heating, or alternatively, by heating in a memory element preparation process after deposition. In the former deposition method based on substrate heating, however, since the substrate temperatures that allow the deposition without causing surface roughness are limited to a narrow temperature-range in the neighborhood of 100° C., process temperature margins are very narrow and temperature control is difficult. Large, nonuniform crystal grains are also generated. In the latter after-deposition in-process heating method, large crystal grains are formed and thus a large number of very small clearances occur between the crystal grains and electrodes or dielectric substances. These clearances have presented the problem in that a decrease in adhesion makes the chalcogenide film prone to peel.

Additionally, in both the substrate-heating deposition method and the after-deposition in-process heating method, the difference in crystallized state between the central and edge portions of the substrate (silicon wafer) has resulted in a lack of uniformity. At the edge portions, in particular, the crystallized state has been very bad, which has made the desired electrical characteristics unobtainable and the film difficult to use. During the crystallization, whether it be by the substrate-heating deposition or by after-deposition in-process heating, since the crystal form obtained differs significantly from that obtained during memory rewriting. This difference has posed the further problem in that since the large resistivity of the chalcogenide film at the stages with a small number of rewriting cycles has resulted in unstable recording from the very first cycle. Moreover, since the crystal grain size is substantially the same as or greater than the size of the lower electrode, the characteristics obtained depend on where in the crystal grains the lower electrode is formed. Such dependence has caused the nonuniformity of characteristics between elements.

The above-mentioned heat treatment is described in further detail below. Typical examples of the chalcogenide materials used for optical disks at present include GeSbTe. It is known that when annealed, an amorphous GeSbTe film is crystallized into a face-centered cubic ("fcc") structure at about 150° C. and that when further reheated to a high temperature of 350° C. or more, the "fcc" crystal undergoes a phase transition into a hexagonal closest- or close-packed ("hcp") structure. This phase transition is described in, for example, Non-Patent Reference 2 (Journal of Applies Physics, Vol. 87, Issue No. 9, page 4130, May 2000). That is to say, the "fcc" crystal is of a low-temperature phase, and the "hcp" crystal is of a high-temperature phase. Optical disks use a polycarbonate substrate low in heat resistance, so their manufacturing process temperatures are limited to about 120° C. or less. For this reason, GeSbTe films are formed in an amorphous pahse. These films are crystallized into an "fcc" structure when irradiated with a set pulse by means of a laser, and become amorphous when irradiated with a reset pulse.

Phase change memories, however, require the formation of metallic interconnects, so these memories necessarily need to go through annealing at 400° C. or more. As a result, GeSbTe films are formed into an "hcp" crystal structure. These crystals become amorphous when a reset pulse is applied, and are recrystallized into an "fcc" structure when a set pulse is applied. That is to say, the "hcp" crystals of GeSbTe films are of a structure specific to the manufacturing processes for phase change memories.

The present inventors test-produced phase change memories to find that when a GeSbTe film is annealed at 400° C., "hcp" crystal grains tend to grow in an oblique direction. Hereinafter, the crystal grains that have grown in the oblique direction are described as inclined crystal grains. A sectional schematic representation of inclined crystal grains is shown in FIG. 7.

FIG. 7 indicates that the "hcp" crystal grains A3 of the GeSbTe film formed on a substrate A1 grow in an oblique direction, voids A4 occur particularly at the interface between the substrate A1 and the crystal grains A3. The voids A4 cause the peeling of the GeSbTe film due to a decrease in the adhesion thereof, the nonuniformity of resistance due to improper contact with a plug, or other undesirable events. Accordingly, means for suppressing the occurrence of the voids has been demanded.

No such events are observed in the "fcc" crystals of GeSbTe films. This indicates that only phase change memories require suppressing the growth of inclined crystal grains.

The present invention is therefore intended to solve the above problem specific to phase change memories. More specifically, an object of the invention is to provide a semiconductor storage device having a highly reliable phase change memory, and a method and apparatus for manufacturing the semiconductor storage device.

The following describes typical means for solving the above problem according to the present invention:

(1) A feature of first means for forming a phase change memory cell in the semiconductor storage device of the present invention is that the deposition process of forming a chalcogenide layer on a semiconductor substrate is conducted under conditions which render the chalcogenide layer amorphous. In general, this deposition process uses a sputtering method. However, sputtering is not always required. The deposition process can use any other well-known deposition method, for example, chemical vapor deposition (CVD) or the sol-gel method, only if the deposition method permits the formation of an amorphous chalcogenide layer.

In the manufacture of conventional phase change memories, chalcogenide layers, unlike those of optical disks, have been formed in a crystal state. The reasons for this are first described below.

As described earlier, it is known that GeSbTe, a typical chalcogenide material, is crystallized into an "fcc" structure when annealed at about 150° C.

During the formation of a film by sputtering, since they have a high energy level, sputtered particles can move in the film surface to a certain extent in search of a position stable in terms of energy. During the formation of the film by sputtering, therefore, the GeSbTe film is crystallized, even at a substrate temperature lower than a post-annealing crystallization temperature of 150° C. The crystallization during film formation with sputtering is called in-situ crystallization. The in-situ crystallization temperature of the GeSbTe film depends on sputtering conditions. It can be considered, however, that this temperature is about 100° C.

In general, during the manufacture of a semiconductor integrated circuit, before a thin film is formed by sputtering, moisture that has adsorbed onto the surface of a semiconductor substrate needs to be removed by heating the substrate in a vacuum (this heating process is called preheating). In general types of sputtering apparatus, a preheating chamber and a sputtering chamber are separated from each other, in which case, the substrate after being preheated is carried in a vacuum from the preheating chamber to the sputtering chamber. A temperature from about 200° C. to 300° C. and a time of 30 seconds can be presented as an example of specific preheating conditions. In phase change memories, preheating is performed to prevent moisture from remaining between the plug and chalcogenide layer of the memory.

When preheating is immediately followed by the formation of the GeSbTe film, this film will be crystallized in situ since the substrate temperature will have reached or exceeded 100° C. Even if preheating is omitted or the substrate, after being preheated, is sufficiently cooled down and then the GeSbTe film is formed, in-situ crystallization of the GeSbTe film will also occur since the substrate temperature will be increased by the conversion of the high energy of sputtered particles into heat on the substrate surface.

For optical disks, preheating is not required because of no effects of any moisture left on the substrate surface. In addition, temperature increases during sputtering become almost no problem since the film thickness of GeSbTe is as small as about 10 nm, which is about 1/10 of the film thickness required of a phase change memory. Therefore, it is the characteristic phenomenon of phase change memories that the GeSbTe film crystallizes in situ when formed by sputtering. The film thickness of the GeSbTe film in a phase change memory generally ranges from about 50 to 200 nm.

Next, the problems arising from the in-situ crystallization of the chalcogenide layer are described below. A sectional schematic representation of a GeSbTe film which was crystallized in situ during sputtering-based formation of the film is shown in FIG. 9. The chalcogenide layer A5 on substrate A1 becomes a grain-shaped "fcc" crystal. Also, an X-ray diffraction pattern diagram is shown in FIG. 10. This diagram indicates that the "fcc" crystal is a randomly oriented crystal not exhibiting any specific orientation.

A sectional schematic representation of the in-situ crystallized GeSbTe film after being subjected to the annealing process of 400° C., required for the manufacture of phase change memories, is shown in FIG. 7. In the chalcogenide layer A3 formed on substrate A1, "hcp" crystal grains grow in an oblique direction and voids A4 are formed. Also, an X-ray diffraction pattern diagram is shown in FIG. 8. This diagram indicates that the since diffraction lines due to crystal faces (005), (009), (0010) are observed, the "hcp" crystal is preferentially oriented on face (00L). In the range of the data which was measured this time, numerals 5, 9 and 10, is assigned to L. In a wider measuring range, however, diffraction lines from the crystal faces expressed by other numerals will, of course, be observed. Hereinafter, these equivalent crystal faces are referred to collectively as (00L).

The problems discussed above can be summarized as follows: in-situ crystallization of GeSbTe forms randomly oriented "fcc" crystal grains, the annealing of which then results in the growth of inclined "hcp" crystal grains oriented on (00L); the growth of the inclined "hcp" crystal grains generates voids at the interface to the substrate, thus causing the peeling of the GeSbTe film due to reduced adhesion, the nonuniformity of electrical resistance due to improper contact with a plug, or other undesirable events.

Accordingly, the present inventors found that forming GeSbTe under the conditions where it becomes amorphous is effective as the means for suppressing the growth of the inclined crystal grains. More specifically, the inventors found it to be effective to suppress the in-situ crystallization of GeSbTe when depositing it on the substrate, and then perform the deposition under the conditions that render GeSbTe amorphous.

A sectional schematic representation of a GeSbTe film A2 after it was formed on a substrate A1 in amourphous phase and then subjected to 400° C. annealing required during the manufacturing processes for the phase change memory is shown in FIG. 1. In the chalcogenide layer A2 formed on the substrate A1, "hcp" crystal grains grow in a direction vertical to the surface of the substrate and form a continuous columnar structure in the direction of film thickness. Also, an X-ray diffraction pattern diagram of the chalcogenide layer A2 of the columnar structure is shown in FIG. 2. This diagram indicates that unlike the (00L) oriented "hcp" crystal as shown in FIG. 8, the "hcp" crystal is a randomly oriented crystal not exhibiting any specific orientation.

In other words, when the GeSbTe film A2 is to be formed by sputtering, if the GeSbTe film A2 is formed under the conditions where it becomes amorphous, it is possible to keep inclined crystal grains from growing during the annealing treatment (of at least 400° C.) that is required in the manufacturing processes for the phase change memory.

The reasons for this are described below. The difference between the X-ray diffraction patterns in FIGS. 2 and 8 is that diffraction lines due to the crystal faces (012), (013), (016), (110), (023) observed in FIG. 2 are not observed in FIG. 8. That is, for the in-situ crystallized GeSbTe film in FIG. 8, annealing at 400° C. causes crystal grains to grow by adhering to one another, and at the same time, crystal face (00L) is preferentially oriented in a direction horizontal to the substrate surface. Since crystal face (00L) is the hexagonal closest-packed ("hcp") face, it stands to reason that the crystal grains grow in the horizontal direction with respect to the substrate surface. When crystal face (00L) is preferentially oriented, other crystal faces, namely, crystal faces (012), (013), (016), (110), (023), and the like each grow with a certain angle with respect to the substrate surface. Theoretically, the GeSbTe film has an inclination of about 57 degrees between, for example, crystal face (00L) and the crystal face (013) exhibiting the greatest peak in FIG. 2. For this reason, it is probable that when crystal face (00L) is preferentially oriented, inclined crystal grains grow.

After GeSbTe has been formed in an amorphous phase, however, even when 400° C. annealing is provided, the "hcp" crystal is not preferentially oriented and becomes a randomly oriented crystal. This indicates that as shown in FIG. 2, not only crystal face (00L), but also crystal faces (012), (013), (016), (110), (023), and the like can grow horizontally with respect to the substrate surface. It is therefore probable that the growth of these crystal faces suppresses the growth of the inclined crystal grains and forms the columnar structure.

One specific means for forming GeSbTe under the conditions where it becomes amorphous would be by adding a process of cooling the substrate down below the crystallization temperature of the chalcogenide layer after the substrate has been preheated. Substrate cooling may be conducted continuously in the preheating chamber, or it may be conducted in a cooling chamber equipped with sputtering apparatus, or conducted after the substrate has been carried to the sputtering chamber.

Another means would be by controlling the temperature of the substrate below the crystallization temperature of the chalcogenide layer (i.e., below glass transition point Tg) during the formation of the chalcogenide layer. The control target temperature can be any value below the crystallization temperature. To allow for the simplicity and convenience of the apparatus configuration and for its throughput, however, it is desirable that the target temperature be within a range of 50° C. to 100° C.

Since the use of these means allows the chalcogenide layer to be formed in an amorphous phase, inclined growth of the "hcp" crystal grains can be suppressed, even when 400° C. annealing is conducted that is required for the manufacture of the phase change memory.

(2) A feature of second means for forming a phase change memory cell in the semiconductor storage device of the present invention is that the deposition process of forming an amorphous chalcogenide layer by sputtering is followed by conducting the annealing process of forming an "fcc" crystal of a columnar structure by annealing the chalcogenide layer.

A sectional schematic representation of a GeSbTe film after it was formed in an amorphous phase and then annealed at 200° C. for three minutes is shown in FIG. 11. In the chalcogenide layer A6 formed on the substrate A1, "fcc" crystal grains grow in a direction vertical to the surface of the substrate, and form a continuous columnar structure in the direction of film thickness. The X-ray diffraction pattern obtained at this time is shown in FIG. 12. It can be seen that compared with the randomly oriented "fcc" crystal shown in FIG. 10, the above "fcc" crystal has a significantly oriented crystal face (111). Since the crystal face (111) is the closest-packed "fcc" face, it stands to reason that the crystal grains readily grow in the horizontal direction with respect to the substrate surface.

When the "fcc" crystal of a columnar structure that has been obtained by annealing at 200° C. is further subjected to 400° C. annealing required during the manufacturing processes for the phase change memory, the "fcc" crystal assumes substantially the same sectional shape as the sectional schematic representation in FIG. 1. That is, in the chalcogenide layer A2 formed on the substrate A1, "hcp" crystal grains grow in a direction vertical to the surface of the substrate, and form a continuous columnar structure in the direction of film thickness. The X-ray diffraction pattern of the "hcp" crystal is also much the same as the pattern shown in FIG. 2. In other words, the "hcp" crystal is a randomly oriented crystal not exhibiting any specific orientation. This indicates that if GeSbTe is annealed at about 200° C. to form an "fcc" crystal of a columnar structure, it is possible to keep inclined crystal grains from growing during the annealing process of about 400° C., required in the manufacturing processes for the phase change memory. That is because, if crystal grains of a columnar structure are formed at the stage of the "fcc" crystal, phase transition from "fcc" to "hcp" occurs with that columnar structure remaining maintained.

A temperature of 100° C. or more and up to 400° C., a time of 30 seconds or more, and up to 10 minutes, and an atmosphere of an inert gas such as an argon (Ar) gas, or of a non-oxidizing gas such as a nitrogen or hydrogen gas, can be presented as an example of the above annealing process conditions.

As described above, the use of the first means or the second means allows the inclined growth of the "hcp" crystal grains to be suppressed, even when 400° C. annealing is conducted that is required for the manufacture of the phase change memory. More specifically, the rate of the columnar crystal grains which grow in the vertical direction with respect to the substrate surface remarkably increases above the rate of the inclined crystal grains which grow in a direction oblique to the substrate surface.

While the features of the first means and the second means have been described above, it goes without saying that a combination of these means is further effective in the present invention.

That is, combining the first means and the second means makes it possible to further suppress the growth of the inclined crystal grains. The first step in this case is to form the chalcogenide layer so as to be amorphous, and then crystallize this layer in the "fcc" state of a columnar structure by post-annealing. Using this method allows the rate of the columnar crystal grains to be increased to at least 80% or more of all crystal grains (columnar crystal grains+inclined crystal grains).

Combining the first means and the second means in addition to the above also makes it possible to improve substrate in-plane nonuniformity of electrical characteristics. With the first means alone, since crystallization abruptly progresses from an amorphous phase to a high-temperature "hcp" phase, the ratio between columnar crystal grains and inclined crystal grains may differ, for example, between the central and peripheral portions of the substrate. The progress rate of the crystallization, however, can be smoothed by combining the first means and the second means and forming a high-temperature "hcp" phase from an amorphous phase via the low-temperature "fcc" phase. This method makes it possible to suppress substrate in-plane nonuniformity of electrical resistance and other characteristics.

Third means, which will be detailed in an embodiment, is by forming a chalcogenide film in which the average width of crystal grains in the film when cut in parallel to the surface thereof centrally in the direction of film thickness, at a section vertical to the film surface, is smaller than the maximum contact region width of either one of two electrodes formed across the film (that is, of the two electrodes each having a contact region in direct or indirect contact with the film, the electrode smaller in the maximum width of the contact region). Indirect contact refers to contact via a thin dielectric layer or electroconductive layer having a film thickness of 20 nm or less. A combination with the composition of a chalcogenide film not causing a significant change in crystal form during a process of 400° C. after initial crystallization is conducted during the formation of the film. Surface protection with a thin electroconductive layer or dielectric layer is provided during the initial crystallization. The initial crystallization is conducted under specific high-temperature short-time process conditions by electric furnace heating.

For example, according to F. Pellizzer et al.: "2004 Symposium on VLSI Technology Digest of Technical Papers", IEEE, 2004, pp. 18-19, although the contact section between the electrode (heater) portion and the chalcogenide film portion is of an elongated shape, even if the crystal grains are larger than the width of the smaller portion, provided that the crystal grains are smaller than the width of the larger portion, the nonuniformity in characteristics between elements can be suppressed since any effects of the crystal grains are averaged.

The apparatus that causes laser crystallization has a high-power laser, a laser head for irradiating the surface of a silicon wafer with the laser light emitted from the laser, and a conveyance mechanism for moving the silicon wafer in at least one direction, wherein the laser crystallization apparatus has a pulsed-light irradiation capability to ensure a laser spot area of $10^{-6}$ cm$^2$ or more and up to $10^{-3}$ cm$^2$, on the irradiated silicon wafer surface and an irradiation time of 100 ns or more and up to 1 second. Use of the above apparatus makes it possible to give high-density appropriate irradiation energy to the phase change material of a phase change memory, and uniformly crystallize the entire surface of the phase change material of a nonvolatile phase change memory. In addition, the use of the above apparatus makes it possible to heat only a phase change material within a short time and increase the temperature of the phase change material to a crystallization temperature. Furthermore, a crystal structure approximate to that of a set state can be formed without causing thermal damage (due to a volumetric change) to the stacked layers neighboring the phase change material. The object mentioned earlier in this document can thus be fulfilled.

The above means is also effective for the chalcogenide film of a phase change transistor.

The advantageous effects obtained from typical features and characteristics of all those disclosed by the present invention are briefly described below.

The occurrence of voids due to the growth of the crystal grains of a chalcogenide film in an oblique direction can be suppressed during the manufacturing processes for a semiconductor storage device. This, in turn, makes it possible to suppress the nonuniformity of electrical characteristics and deterioration of reliability that are due to manufacturing process factors relating to phase change memories.

In-process peeling induced by crystallization can also be prevented. The initial crystallization state and the crystal structure of a set state are close to each other, and characteristics stabilize from the first rewriting operation. The nonuniformity in characteristics between elements due to a large crystal grain size can be reduced.

BRIEF DESCRIPTION OF THE INVENTION

DETAILED DESCRIPTION OF THE PREFERRED EMBODIMENTS

Figure 1:
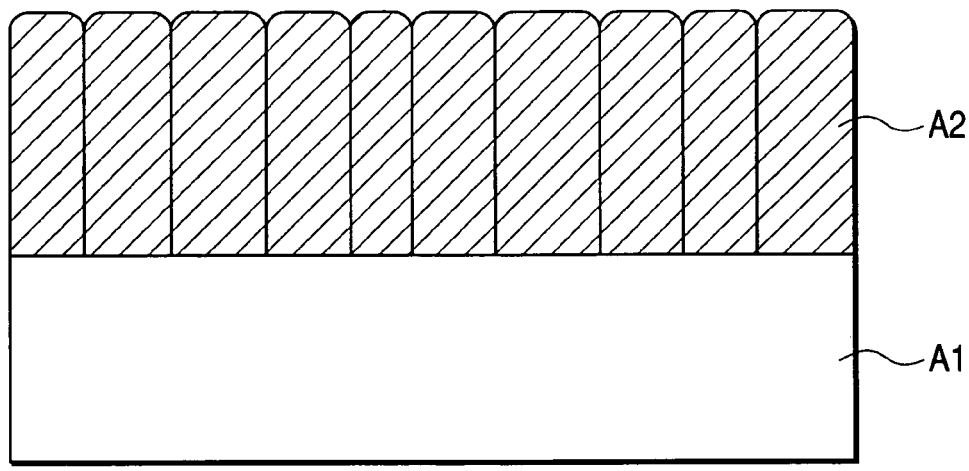
FIG. 1 is a sectional schematic view of a columnar, hexagonal close-packed ("hcp") crystal chalcogenide layer which constitutes a memory cell of a semiconductor storage device of the present invention.
Figure 2:
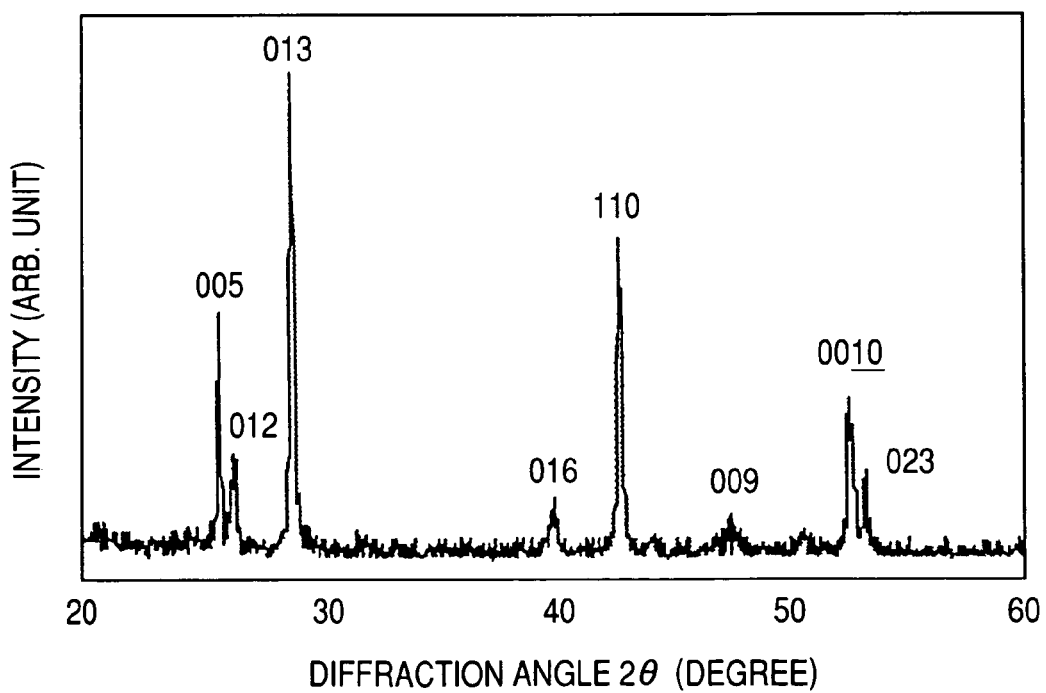
FIG. 2 is an X-ray diffraction pattern diagram of the columnar "hcp" crystal GeSbTe layer shown in FIG. 1.
Figure 3:
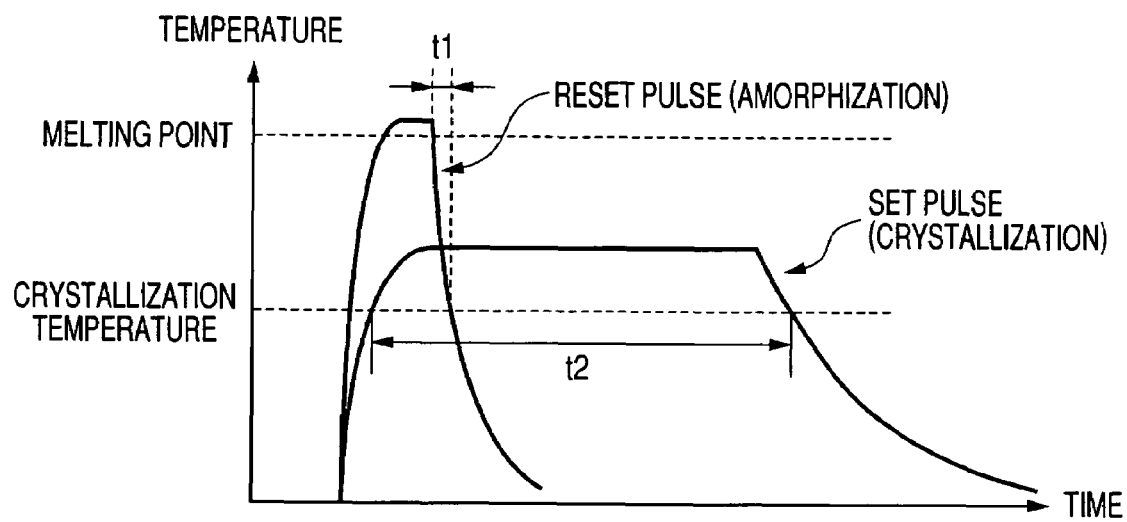
FIG. 3 shows electric-current pulse specifications for changing the phase state of the chalcogenide layer constituting the memory cell.
Figure 4:
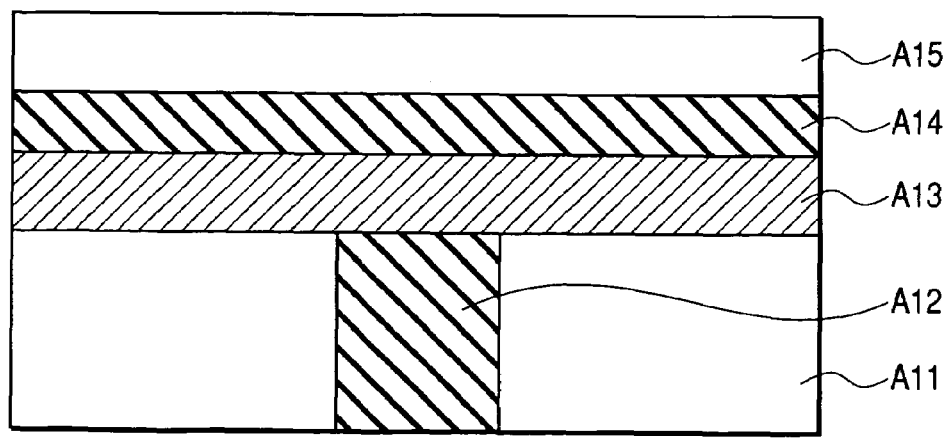
FIG. 4 is a sectional view of a phase change memory cell in certain manufacturing process steps.
Figure 5:
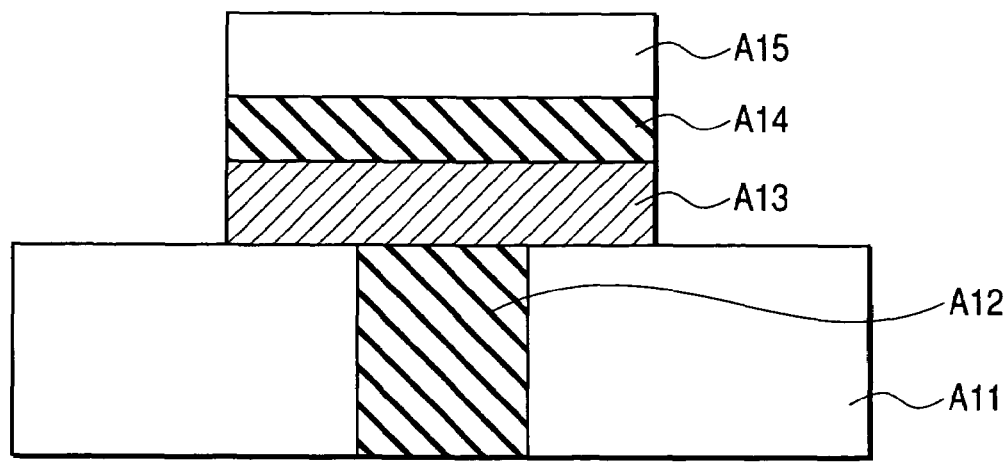
FIG. 5 is a sectional view of the above phase change memory cell in additional manufacturing process steps.
Figure 6:
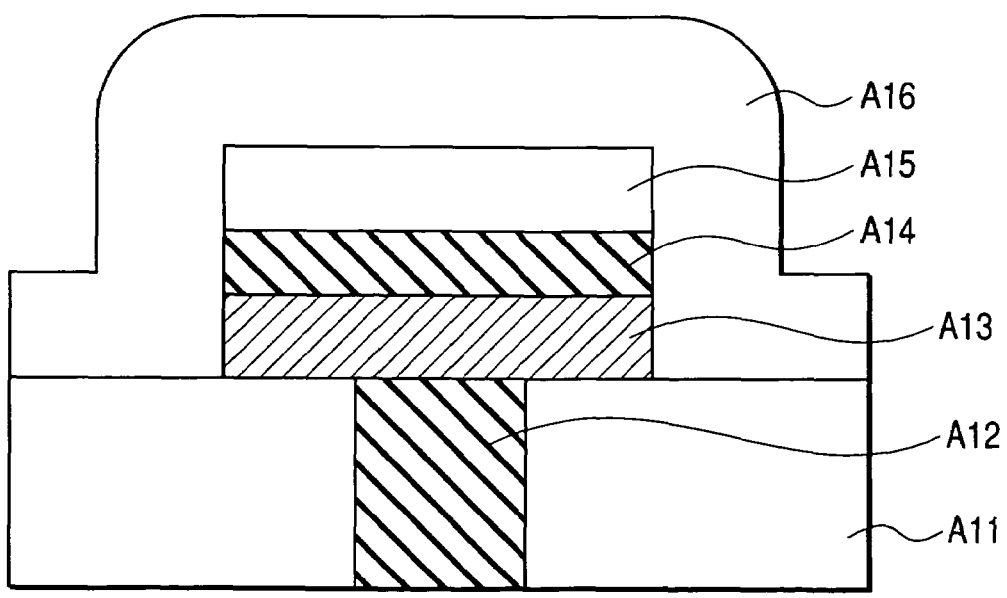
FIG. 6 is a sectional view of the above phase change memory cell in further additional manufacturing process steps.
Figure 7:
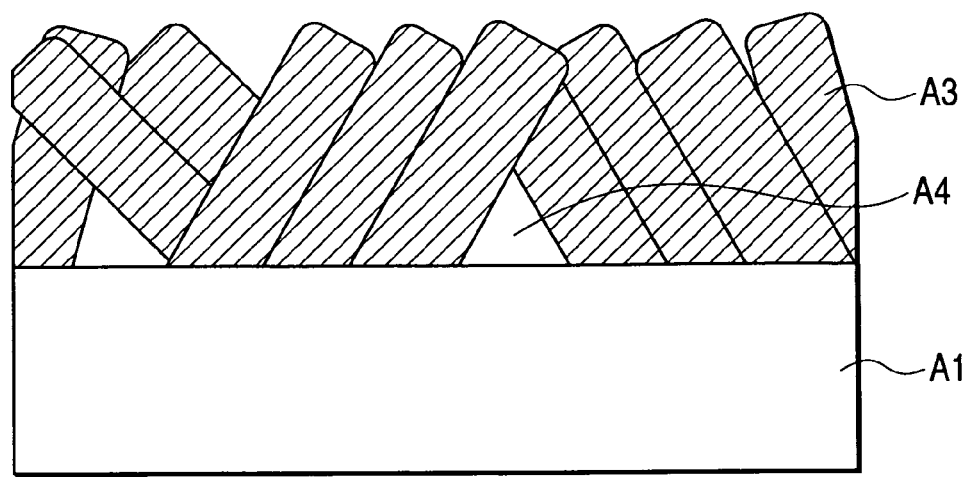
FIG. 7 is a sectional schematic representation of a conventional chalcogenide film (inclined "hcp" crystal)
Figure 8:
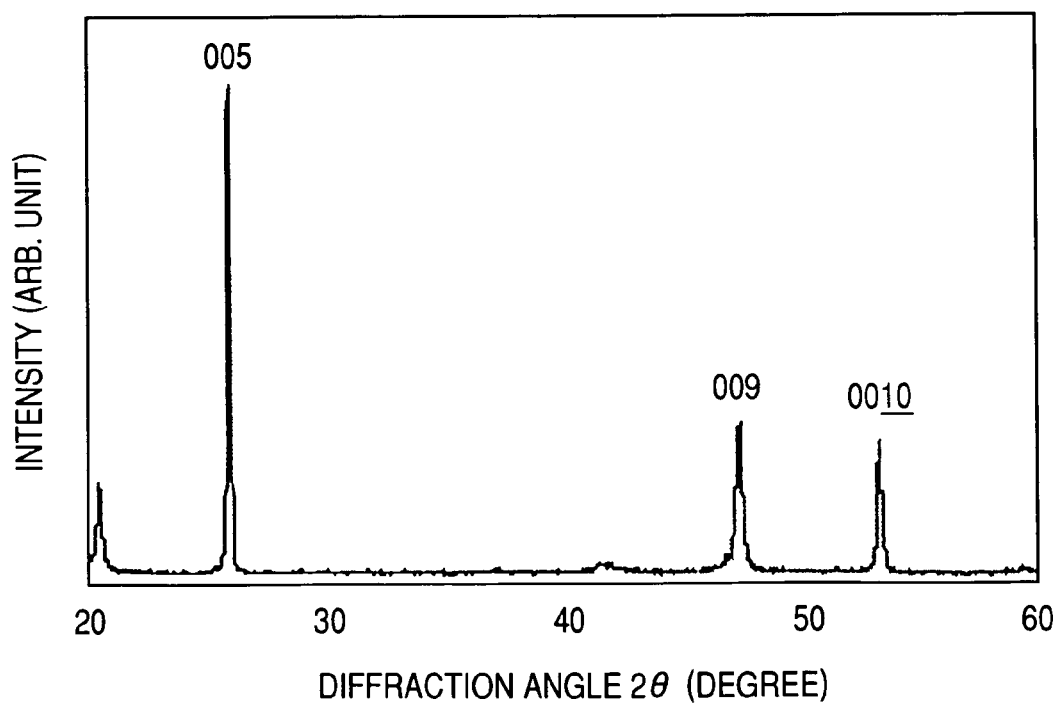
FIG. 8 is an X-ray diffraction pattern diagram of the inclined "hcp" crystal GeSbTe layer shown in FIG. 7.
Figure 9:
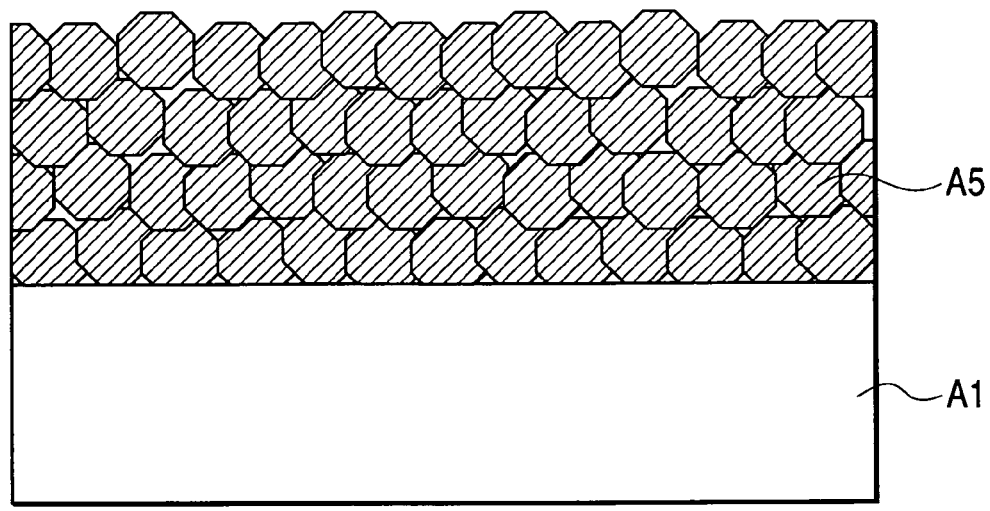
FIG. 9 is a sectional schematic representation of the chalcogenide layer crystallized in situ (as a grain-shaped "fcc" crystal) during deposition.
Figure 10:
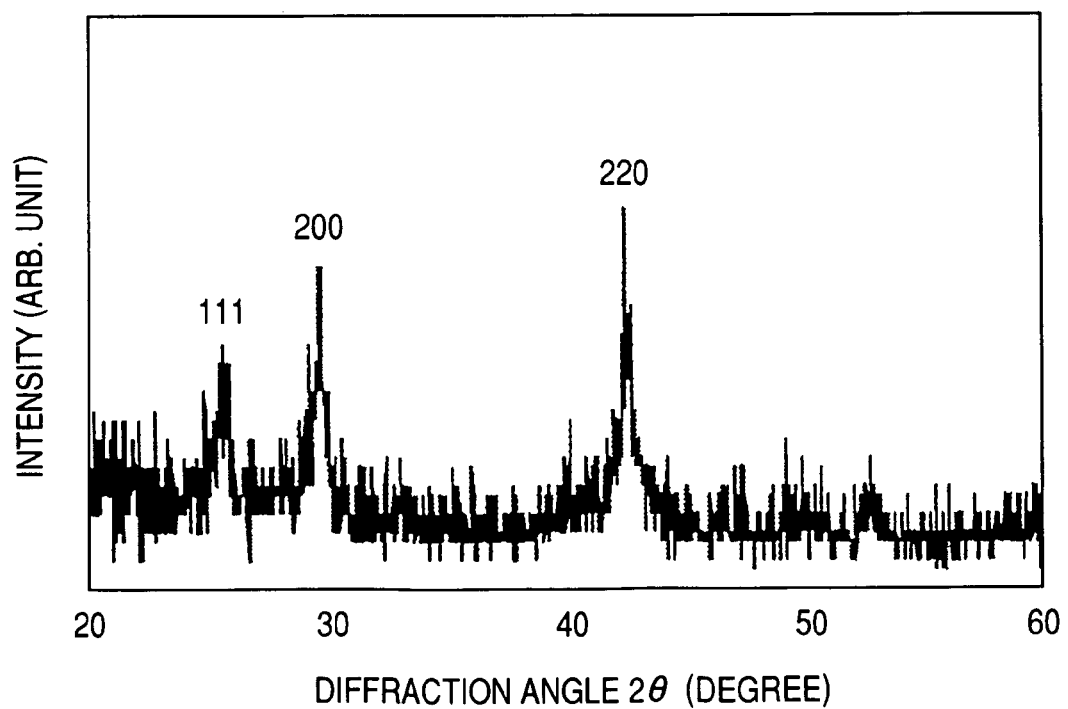
FIG. 10 is an X-ray diffraction pattern diagram of the grain-shaped "fcc" crystal GeSbTe layer shown in FIG. 9.

The typical embodiments of the present invention that can achieve the object thereof are enumerated below.

(1) A first feature of a manufacturing method for a semiconductor storage device according to the present invention exists in that in the semiconductor storage device manufacturing method including a deposition process of forming a chalcogenide layer on a semiconductor substrate as a storage layer to store information by producing a reversible phase change between a crystal phase and an amorphous phase, the deposition process for the chalcogenide layer includes a deposition process of forming the chalcogenide layer by using a sputtering method under conditions that render the chalcogenide layer amorphous.

(2) A second feature of a manufacturing method for a semiconductor storage device according to the present invention exists in that in a memory device manufacturing method including a deposition process of forming a chalcogenide layer on a semiconductor substrate as a storage layer to store information by producing a reversible phase change between a crystal phase and an amorphous phase, the deposition process for the chalcogenide layer includes the deposition process of forming the chalcogenide layer under conditions that render the chalcogenide layer amorphous, and an annealing process of, after the above deposition process, crystallizing into a face-centered-cubic structure the chalcogenide layer that has been formed during the deposition process.

(3) A third feature of a manufacturing method for a semiconductor storage device according to the present invention exists in that in a memory device manufacturing method including the deposition process of forming a chalcogenide layer on a semiconductor substrate as a storage layer to store information by producing a reversible phase change between a crystal phase and an amorphous phase, the deposition process for the chalcogenide layer includes the deposition process of forming the chalcogenide layer by using a sputtering method under conditions which render the chalcogenide layer amorphous, and the annealing process of, after the above deposition process, crystallizing into a face-centered-cubic structure the amorphous chalcogenide layer that has been formed during the deposition process.

(4) A feature of a semiconductor manufacturing apparatus of the present invention exists in that the manufacturing apparatus that manufactures a semiconductor storage device having a chalcogenide layer on a semiconductor substrate as a storage layer to store information by producing a reversible phase change between a crystal phase and an amorphous phase includes a preheating chamber to heat the semiconductor substrate in a vacuum, a cooling chamber to cool the semiconductor substrate, and a sputtering chamber to form the chalcogenide layer.

(5) A feature of a semiconductor storage device of the present invention exists in that the semiconductor storage device includes a semiconductor substrate, a select transistor formed on a major face of the semiconductor substrate, and a storage layer electrically connected to the select transistor in order to store information by producing a reversible phase change between a crystal phase and an amorphous phase, wherein the storage layer includes a chalcogenide layer formed up of hexagonal and columnarly structured crystal grains.

Other features are described in embodiments.

EMBODIMENTS

Embodiments of the present invention are described in detail below in accordance with the accompanying drawings.

First Embodiment

A first embodiment of the present invention is described below with reference to FIGS. 13 and 14. This embodiment intends to suppress a growth of inclined crystal grains by forming a chalcogenide layer under the conditions that render the chalcogenide layer amorphous and is an example in which first means for forming phase change memory cells in a semiconductor storage device of the present invention is shown in detail.

Figure 13:
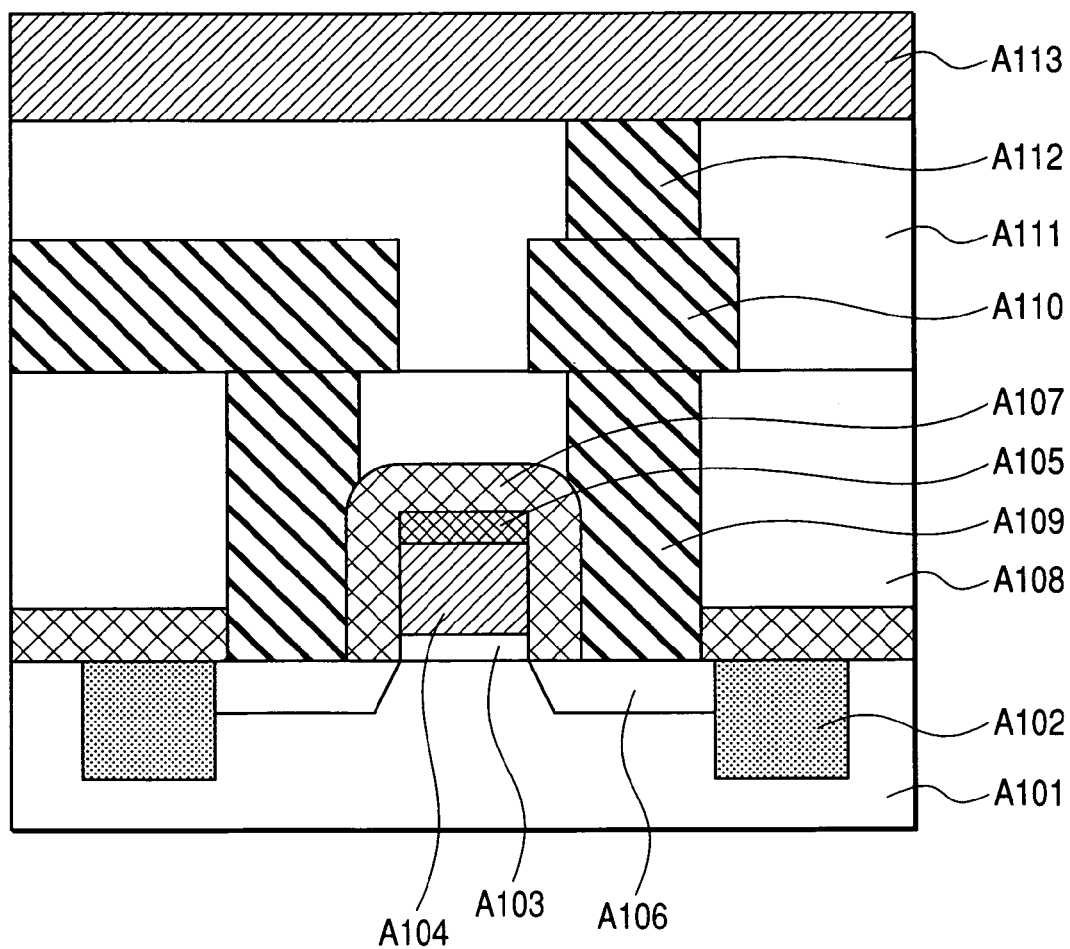
FIG. 13 is a sectional view of a phase change memory cell in certain manufacturing process steps according to an embodiment of the present invention.

As shown in FIG. 13, a semiconductor substrate A101 is prepared for use and an MOS transistor for use as a select transistor is produced. To this end, an inter-element isolation oxide film A102 for isolating the MOS transistor is first formed on the surface of the semiconductor substrate A101 by using a well-known selective deposition method or trench isolation method. The present embodiment employs the trench isolation method that allows surface planarization.

First, an isolation trench is formed in the substrate by using a well-known dry-etching method, and after any damage due to dry etching has been removed from sidewalls and bottom of the trench, oxide films are deposited using a well-known CVD method. Next, an oxide film present in a non-trench section is selectively polished using a well-known chemical mechanical polishing (CMP) method, and only the inter-element isolation oxide film A102 embedded in the trench is left.

Next, although this is not depicted in the figure, two kinds of electroconductive wells different from each other are formed by high-energy impurity implantation.

Next after surface washing of the semiconductor substrate, a gate oxide film A103 of the MOS transistor is grown by a well-known thermal oxidizing method. A gate electrode A104, made of polycrystal silicon, and a silicon nitride film A105 are deposited on the surface of the gate oxide film A103.

This is followed by gate patterning in a lithographic process and a dry-etching process. After this, a diffusion layer A106 is formed by implanting impurities with a gate electrode and a resist as masks.

While the present embodiment uses a polycrystal silicon gate as the gate electrode A104, a polymetal gate that is a stacked structure of a metal/barrier metal/polycrystal silicon can also be used as a low-resistance gate.

Next, for self-limited contact application's sake, a silicon oxide film A107 is deposited using a CVD method.

Next, an interlayer dielectric film A108 formed of a silicon oxide film is deposited on the entire surface, and surface roughness due to the gate electrode A104 is removed by planarizing with a well-known CMP method.

The above is followed by forming a plug contact hole in a lithographic process and a dry-etching process. At this time, in order to avoid exposure of the gate electrode, the interlayer dielectric film A108 is dry-etched under so-called self-limited conditions, namely, under the conditions that the dry-etching rate of the silicon oxide film is higher than that of the silicon nitride film.

Misalignment of the plug contact hole from the diffusion layer A106 can be prevented by using two process steps. First, the silicon nitride film on an upper face of the diffusion layer A106 is left by dry-etching the interlayer dielectric film A108 under the conditions that the dry-etching rate of the silicon oxide film is higher than that of the silicon nitride film. Next, the silicon nitride film on the upper face of the diffusion layer A106 removed by dry-etching under the conditions that the dry-etching rate of the silicon nitride film is higher than that of the silicon oxide film.

After the interlayer dielectric film A108 has been patterned, tungsten is embedded in the plug contact hole and a tungsten plug A109 is formed using a well-known CMP method.

Next, 100-nm-thick tungsten is deposited using a sputtering method, then the tungsten is patterned in a lithographic process and a dry-etching process, and a first electrical interconnect layer A110 is formed. After this, an interlayer dielectric film A111 made of a silicon oxide film is deposited on the entire surface, and roughness of this surface due to the first electrical interconnect layer is removed by planarizing with a well-known CMP method.

The above is followed by forming another plug contact hole in a lithographic process and a dry-etching process. After this, tungsten is embedded in this plug contact hole and a tungsten plug A112 is formed using a well-known CMP method.

Next, a chalcogenide layer A113 formed of a 100-nm-thick GeSbTe film is deposited in a deposition process using a sputtering method. More specific process conditions within the sputtering apparatus used in the deposition process are described below.

First, the semiconductor substrate is preheated in a vacuum for 30 seconds at 200° C. to remove all moisture adsorbed on the surface of the substrate. Next, the semiconductor substrate is carried into a cooling chamber having the sputtering apparatus, and cooled to 100° C. or less. After this, the semiconductor substrate is carried into a sputtering chamber, where a GeSbTe film is then formed by sputtering with the substrate being controlled to a temperature of 100° C. or less. The chalcogenide layer A113 can be formed in an amorphous phase by using these processes.

Figure 14:
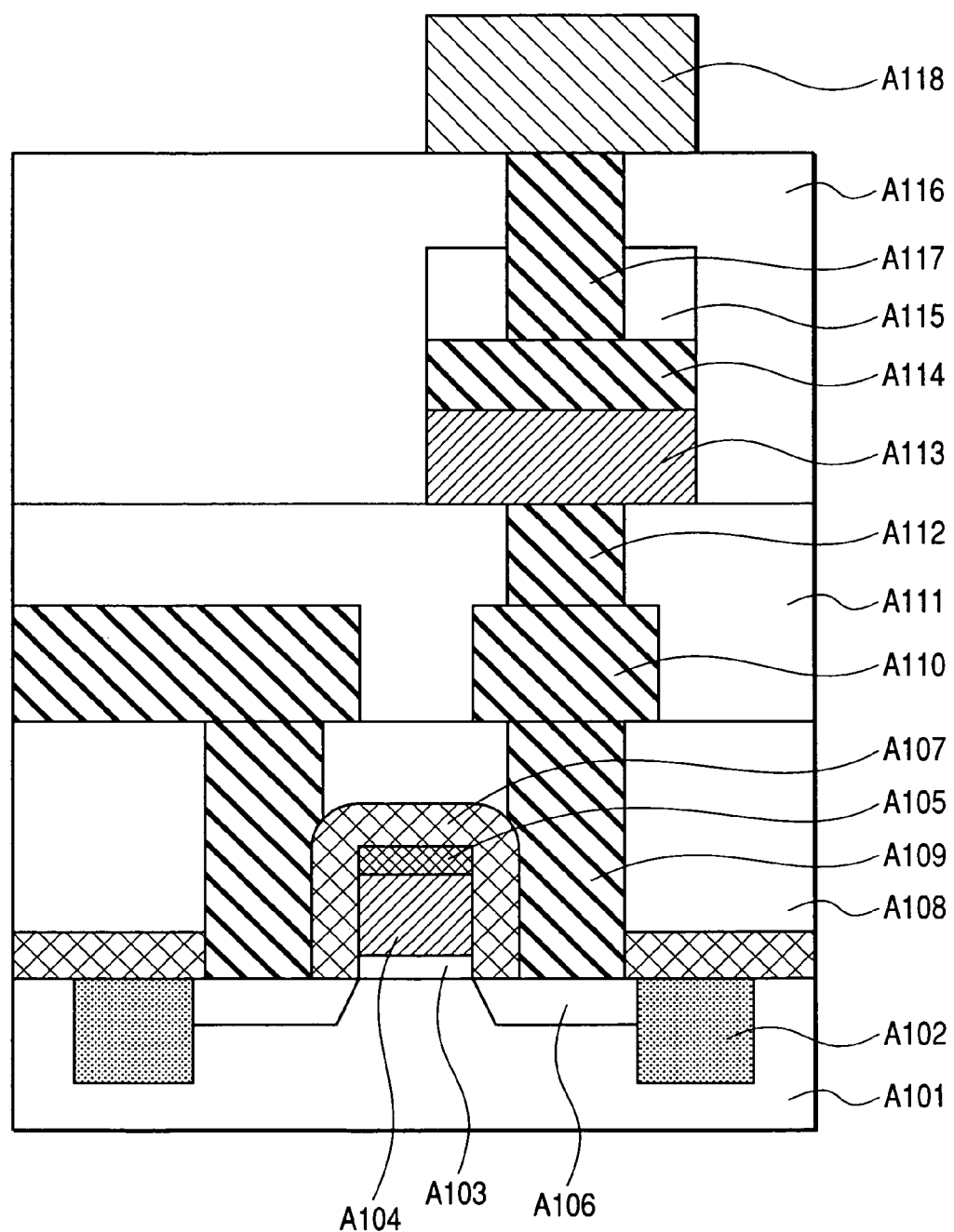
FIG. 14 is a sectional view of a phase change memory cell in certain manufacturing process steps according to an embodiment of the present invention.

Next as shown in FIG. 14, an upper electrode A114 made of a 50-nm-thick tungsten film is deposited using a well-known sputtering method. This is followed by depositing a silicon oxide film A115 using a well-known CVD method, and then patterning the silicon oxide film A115, the upper electrode A114, and the chalcogenide layer A113, in that order, by means of a well-known lithographic process and dry-etching process.

Next, an interlayer dielectric film A116 made of a silicon oxide film is deposited on the entire surface, and roughness of this surface is removed by planarizing with a well-known CMP method. This is followed by forming yet another plug contact hole in a lithographic process and a dry-etching process, then embedding tungsten in this plug contact hole, and forming a tungsten plug A117 using a well-known CMP method. After this, a 200-nm-thick aluminum film is deposited and a second electrical interconnect layer A118 is formed by processing the aluminum film. Of course, copper of low resistance can be used instead of aluminum.

The phase change memory cell of the present embodiment, shown in FIG. 14, is approximately completed by the above processes. In the processes of forming plugs and electrical interconnects (e.g., the upper electrode A114 to the second electrical interconnect layer A118), since annealing at 400° C. or more is required, the chalcogenide layer A113 that was formed in an amorphous phase is crystallized into an "hcp" phase by the phase-change memory manufacturing processes.

According to the first embodiment, the chalcogenide layer A113 is formed in an amorphous phase. As a result, even when 400° C. annealing required for the manufacture of the phase change memory is conducted, the "hcp" crystal takes such a columnar structure as shown in FIG. 1. Inclined crystal grains can therefore be kept from growing.

While GeSbTe is used to form a chalcogenide layer in the above-described embodiment, it is to be understood that the present invention is not limited thereto, and a chalcogenide material containing at least two elements selected from the group consisting of Ge, Sb, and Te, may be used instead. Alternatively, the chalcogenide material used may contain at least two elements selected from the group consisting of Ge, Sb, and Te, and at least one element selected from the group consisting of a group-2b element in the periodic table, such as Zn, a group-1b element such as Ag, an element of groups 3a to 7a, such as Ti, and a group-8 element such as Co.

Since the GeSbTe film is about 100° C. in in-situ crystallization temperature, the substrate temperature during the formation of the film by sputtering is controlled to 100° C. or less to form an amorphous film. However, since a change in the combination of the elements constituting the chalcogenide layer also changes the in-situ crystallization temperature, there is a need to select an appropriate substrate temperature correspondingly. In any case, a substrate temperature lower than glass transition temperature Tg must be maintained to form an amorphous chalcogenide layer.

Second Embodiment

A second embodiment of the present invention is described below with reference to FIGS. 13 and 14. This embodiment intends to suppress a growth of inclined crystal grains by post-annealing a chalcogenide layer and forming an "fcc" crystal of a columnar structure, and is an example in which the second means for forming phase change memory cells in the above-mentioned semiconductor storage device of the present invention is shown in detail.

The description of FIG. 13 is omitted since processes up to forming a tungsten plug A112 are the same as in the first embodiment. After the formation of the plug A112, a chalcogenide layer A113 formed of a 100-nm-thick GeSbTe film in an amorphous phase is deposited using a sputtering method.

Figure 11:
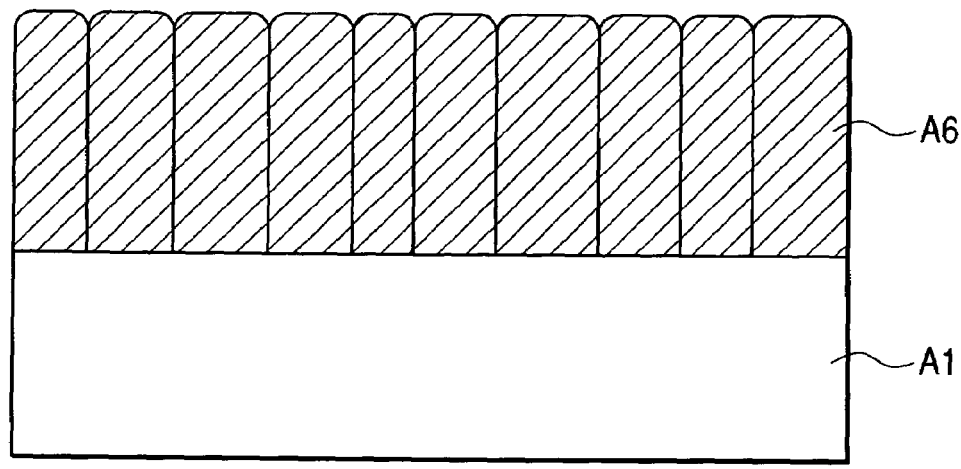
FIG. 11 is a sectional schematic representation of the columnar "fcc" crystal GeSbTe layer obtained by annealing the chalcogenide layer constituting the memory cell of the semiconductor storage device of the present invention.
Figure 12:
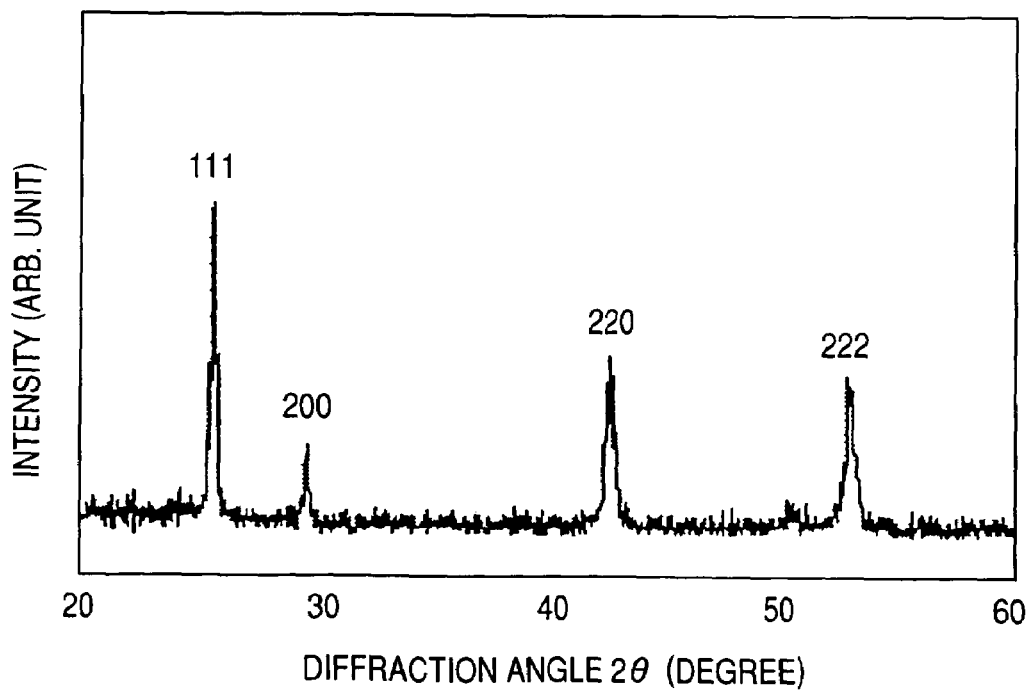
FIG. 12 is an X-ray diffraction pattern diagram of the columnar "fcc" crystal GeSbTe layer shown in FIG. 11.

The deposition is followed by 200° C. three-minute annealing in an argon (Ar) atmosphere. This annealing process forms GeSbTe into such an "fcc" crystal of a columnar structure as shown in FIG. 11. A temperature of 100° C. or more and up to 400° C. can be presented as an example of the annealing process conditions. Also, although an Ar atmosphere is used to conduct the annealing process in the present embodiment, any other inert gas or a non-oxidizing gas such as a nitrogen or hydrogen gas may be used instead.

Next, an upper electrode A114 made of a 50-nm-thick tungsten film is deposited using a well-known sputtering method. This is followed by depositing a silicon oxide film A115 using a well-known CVD method.

While the post-annealing process for crystallizing the chalcogenide layer into an "fcc" crystal phase of a columnar structure precedes the deposition of the upper electrode in the present embodiment, an equivalent effect can likewise be obtained by performing the post-annealing process after the deposition of the upper electrode.

Alternatively, an equivalent effect can likewise be obtained just by controlling the substrate temperature existing during the deposition of the upper electrode A114, to the temperature required for the post-annealing process. Subsequent processes are not described hereinafter since these processes are the same as in the first embodiment.

The phase change memory cell of the present embodiment, shown in FIG. 14, is approximately completed by the above processes. In the processes of forming the plug A117 and electrical interconnect A118, since annealing at 400° C. or more is required, the chalcogenide layer A113 that was formed into an "fcc" crystal of a columnar structure is recrystallized into an "hcp" phase by phase-change memory manufacturing processes.

According to the second embodiment, the chalcogenide layer A113 is formed into an "fcc" crystal of a columnar structure by the post-annealing process. As a result, even when 400° C. annealing required for the manufacture of the phase change memory is conducted, the "hcp" crystal takes such columnar structure as shown in FIG. 1. Inclined crystal grains can therefore be kept from growing.

While GeSbTe is used to form the chalcogenide layer A113 in the above-described embodiment, it is to be understood that the present invention is not limited thereto, and as mentioned in the first embodiment, a chalcogenide material containing at least two elements selected from the group consisting of Ge, Sb, and Te, may be used instead. Alternatively, the chalcogenide material used may contain at least two elements selected from the group consisting of Ge, Sb, and Te, and at least one element selected from the group consisting of a group-2b element in the periodic table, a group-1b element, an element of groups 3a to 7a, and a group-8 element.

A crystallization temperature of the GeSbTe film during annealing is about 150° C., and a phase transition temperature of the film from "fcc" to "hcp" is about 350° C. Post-annealing is therefore conducted at 200° C. However, since a change in the combination of the elements constituting the chalcogenide layer also changes the crystallization temperature and the phase transition temperature, there is a need to select an appropriate post-annealing process temperature correspondingly.

While the invention by the present inventors has been described in detail above in accordance with embodiments, the present invention is not limited to the above embodiments and it goes without saying that various changes and modifications may be made without departing from the scope of the invention.

Also, an example of forming an amorphous chalcogenide layer has been described as the first embodiment, and an example of forming an "fcc" crystal of a columnar structure by post-annealing a chalcogenide layer has been described as the second embodiment. These embodiments, however, can be combined with each other as appropriate. More specifically, the chalcogenide layer is first formed so as to be amorphous, and then this layer is crystallized into a columnarly structured "fcc" phase by post-annealing.

The present invention can be used for a semiconductor integrated circuit device having phase change memory cells formed using a phase change material such as chalcogenide.

Third Embodiment

Figure 15:
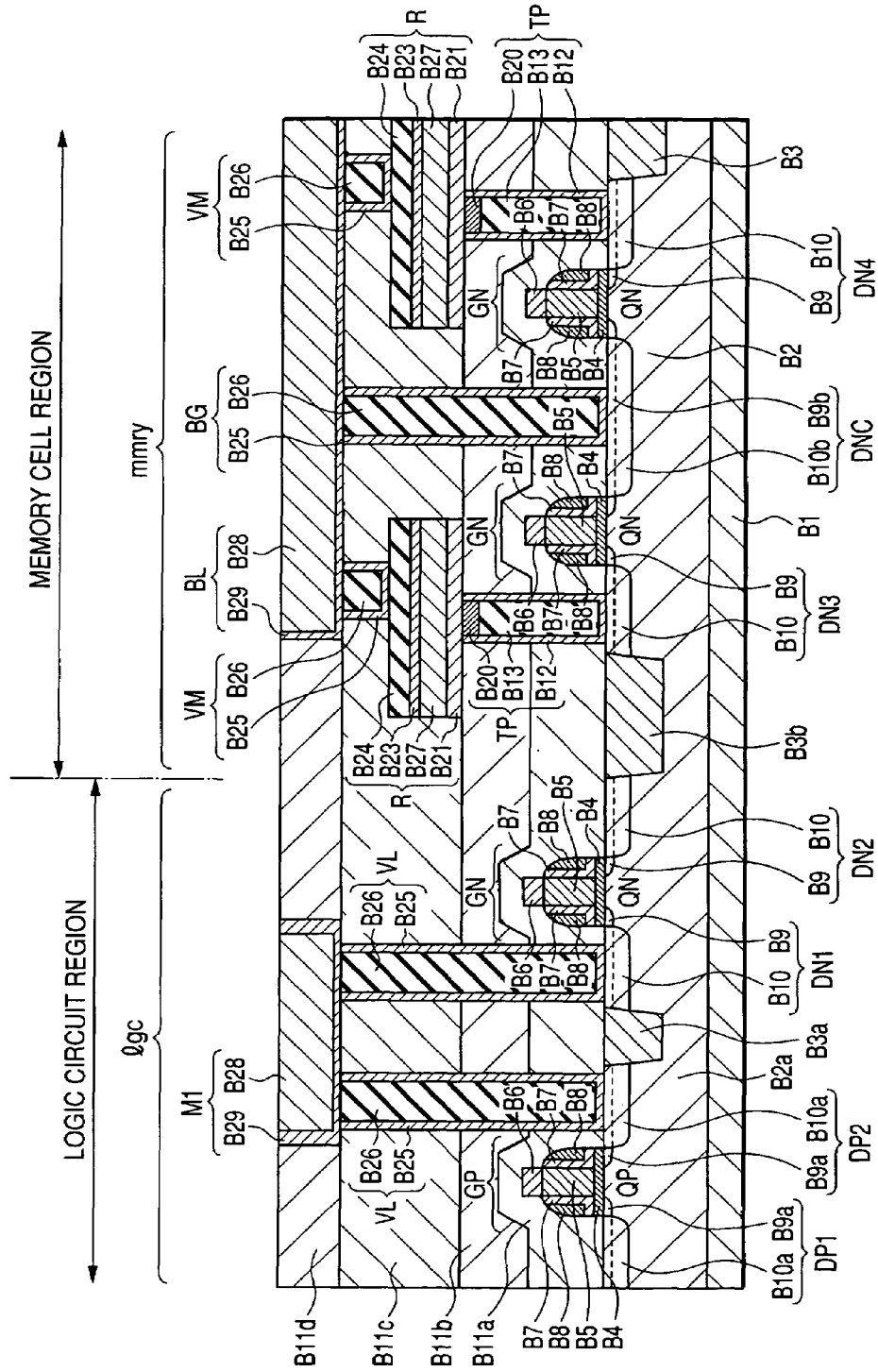
FIG. 15 is a sectional view of major constituent elements of a semiconductor circuit device which is a third embodiment of the present invention.

A structure of a semiconductor integrated circuit device relating to a third embodiment will now be described. This construction is, of course, applicable to the first and second embodiments. FIG. 15 is a sectional view of major elements in a semiconductor integrated circuit device of the third embodiment of the present invention. FIG. 15 shows a sectional view of a logic-mixed memory, a logic circuit region, and a phase change memory cell region. Of the regions shown in FIG. 15, symbol "lgc" denotes the logic circuit region. An n-channel type of MISFET QN is formed in the logic circuit region "lgc". The n-channel type of MISFET QN is formed at an upper portion of a p-well B2, as spaced from each other, and has a semiconductor region DN of a lightly doped drain (LDD) structure, a gate dielectric film B4 formed on a semiconductor substrate B1, and a gate electrode GN formed on the gate dielectric film B4.

A p-channel type of MISFET QP is also formed in this logic circuit region. The p-channel type of MISFET QP is formed at an upper portion of an n-well B2a, as spaced each other, and has a semiconductor region DP of a lightly doped drain (LDD) structure, a gate dielectric film B4 formed on semiconductor substrate B1, and a gate electrode GP formed on the gate dielectric film B4. The n-channel type of MISFET QN and the p-channel type of MISFET QP are isolated by a shallow trench-embedded type of element isolation region 3a. A logic circuit, a memory cell sense amplifier circuit, and other elements are arranged in the logic circuit region.

Also, a memory cell region "mmry" in which phase change memory cells are to be formed is positioned next to the logic circuit region. For example, an n-channel type of MISFET QM for memory cell selection is formed in the memory cell region. The n-channel type of MISFET QM is formed at the upper portion of the n-well B2, as spaced from each other, and has semiconductor regions DN, DNC, of a lightly doped drain (LDD) structure, a gate dielectric film B4 formed on semiconductor substrate B1, and a gate electrode GN formed on the gate dielectric film B4. The semiconductor region DNC is shared by adjacent, n-channel, memory selection MISFETs formed in one element active region.

Such n-channel MISFET QM for memory cell selection, p-channel MISFET QP, and n-channel MISFET QN are covered with the interlayer dielectric films B11a and B11b deposited on the semiconductor substrate B1. The interlayer dielectric films B11a, B11b are each made of, for example, a silicon oxide film, and formed using, for example, a well-known plasma CVD method or the like. The interlayer dielectric film B11b has an upper face formed evenly so that its height is approximately the same in the memory region and the logic circuit region. Both the interlayer dielectric films B11a and B11b in the memory cell region "mmry" have such a pierced connection hole that exposes an upper face of the semiconductor region DN of the MISFET QM for memory cell selection. A barrier metal M12 made of, for example, a titanium film or a titanium nitride film, and a conductive material B13 made of, for example, tungsten, are embedded in the connection hole. A lower contact electrode TP of a memory cell with an embedded high-resistance conductive material B20 made of, for example, a titanium nitride film, is further formed on the barrier metal M12. The lower contact electrode TP of the memory cell is electrically connected to the semiconductor region DN of the memory cell selection MISFET QM. An interlayer dielectric film B11c is deposited on an upper face of the interlayer dielectric film B11b. The interlayer dielectric film B11c is formed of a silicon oxide, for example.

A resistive element R to function as a memory element is formed in the interlayer dielectric film B11c of the memory cell region. The resistive element R is formed into a plate shape and includes a film anti-peeling film B21 made of, for example, a silicon nitride, a laser-crystallized phase-change recording film B27 surface-covered with the film B21, a memory cell upper plate electrode interfacial layer B23 made of, for example, tungsten and, for example, surface-covered with the film B27, and a memory cell upper plate electrode B24 made of, for example, tungsten and surface-covered with the film B23. The phase-change recording film B27, one of the components of the resistive element R, includes, for example, chalcogenide materials $Ge_2Sb_2Te_5$, $Ge_3Sb_2Te_6$. A lower portion of the resistance element R is electrically connected to a memory cell lower contact electrode TP, through which the resistance element R is further electrically connected to the semiconductor region DN of the n-channel MISFET QM for memory cell selection.

The interlayer dielectric film B11c in the memory cell region "mmry" has such a pierced connection hole that exposes an upper face of the memory cell upper plate electrode B24. A barrier metal B25 made of, for example, a titanium film and a titanium nitride film is embedded in the connection hole. A metal film made of tungsten B26 is further embedded to form a memory cell upper electrode contact VM. A bit line contact BC constituted by a barrier metal B25a and tungsten B26a is formed in the semiconductor region DNC of the memory cell region "mmry". The bit line contact BC is electrically connected to the semiconductor region DNC shared by memory cell section n-channel MISFET QM1, QM2.

The semiconductor region DP in the logic circuit region "lgc" has a formed via electrode contact VL constituted by a barrier metal B25a and tungsten B26a. The via electrode contact VL is electrically connected to the semiconductor region DP of the p-channel MISFET QP. The semiconductor region DN in the logic circuit region "lgc" has a formed via electrode contact VL constituted by a barrier metal B25a and tungsten B26b. This via electrode contact VL is electrically connected to the semiconductor region DN of the n-channel MISFET QP.

The interlayer dielectric film B11c has an upper face formed evenly so that its height is approximately the same in the memory region "mmry" and the logic region "lgc". An interlayer dielectric film B11d is deposited on an upper face of the interlayer dielectric film B11c. The interlayer dielectric film B11d is formed of a silicon oxide, for example. A bit line BL and a first electrical interconnect M1 are formed in the interlayer dielectric film B11d. A barrier metal B28 made of, for example, a titanium film and a titanium nitride film, and tungsten B29 are deposited in order from a lower layer to form the bit line. The bit line BL is electrically connected to the bit line contact BC, through which the bit line BL is further electrically connected to the semiconductor region DNC of the memory cell section n-channel MISFET QM.

A barrier metal B28 made of, for example, a titanium film or a titanium nitride film, and a tungsten film B29 are deposited in order from a lower layer to form the first electrical interconnect M1 of the logic circuit region. The first electrical interconnect M1 is electrically connected to the via electrode VL, through which the first electrical interconnect M1 is further electrically connected to the semiconductor region DP of the p-channel MISFET QP and to the semiconductor region DN of the n-channel MISFET QN.

Figure 28:
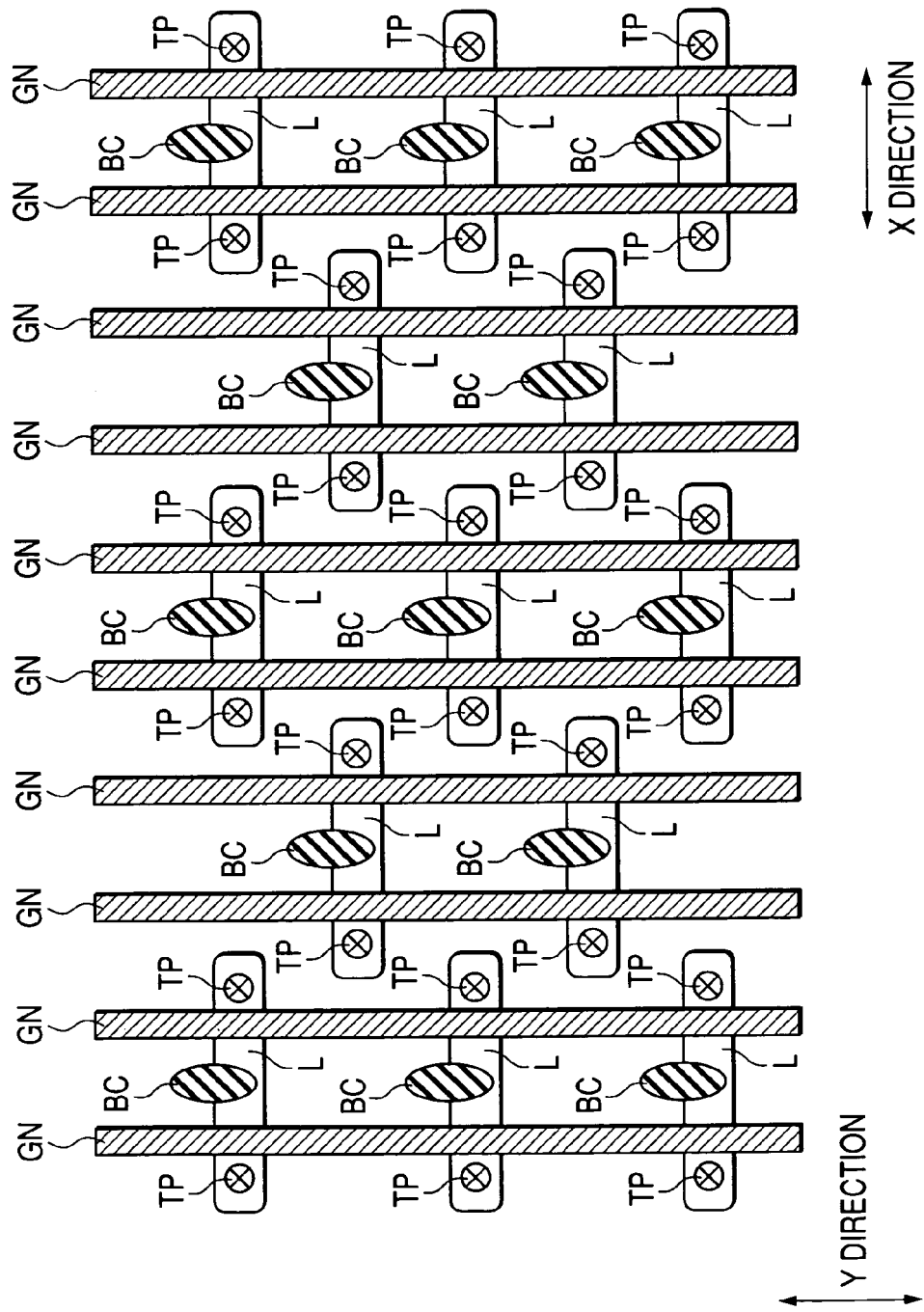
FIG. 28 is a layout view of the major constituent elements of the semiconductor circuit device shown in FIG. 15.

Next, layout of major sections in the memory cell region of the first embodiment is described below referring to FIGS. 28 and 29. First as shown in FIG. 28, n-channel MISFET active regions (element active regions or element formation regions) L each having a gate electrode GN are formed on a p-well. The gate electrode GN is used as a word line of a memory cell array. Also, memory cell lower contact electrodes TP are formed on the n-channel MISFET active regions. In addition, bit line contacts BC are formed on the n-channel MISFET active regions. Each bit line contact BC is formed so as to be convex with respect to a Y-direction of each n-channel MISFET active region.

Figure 29:
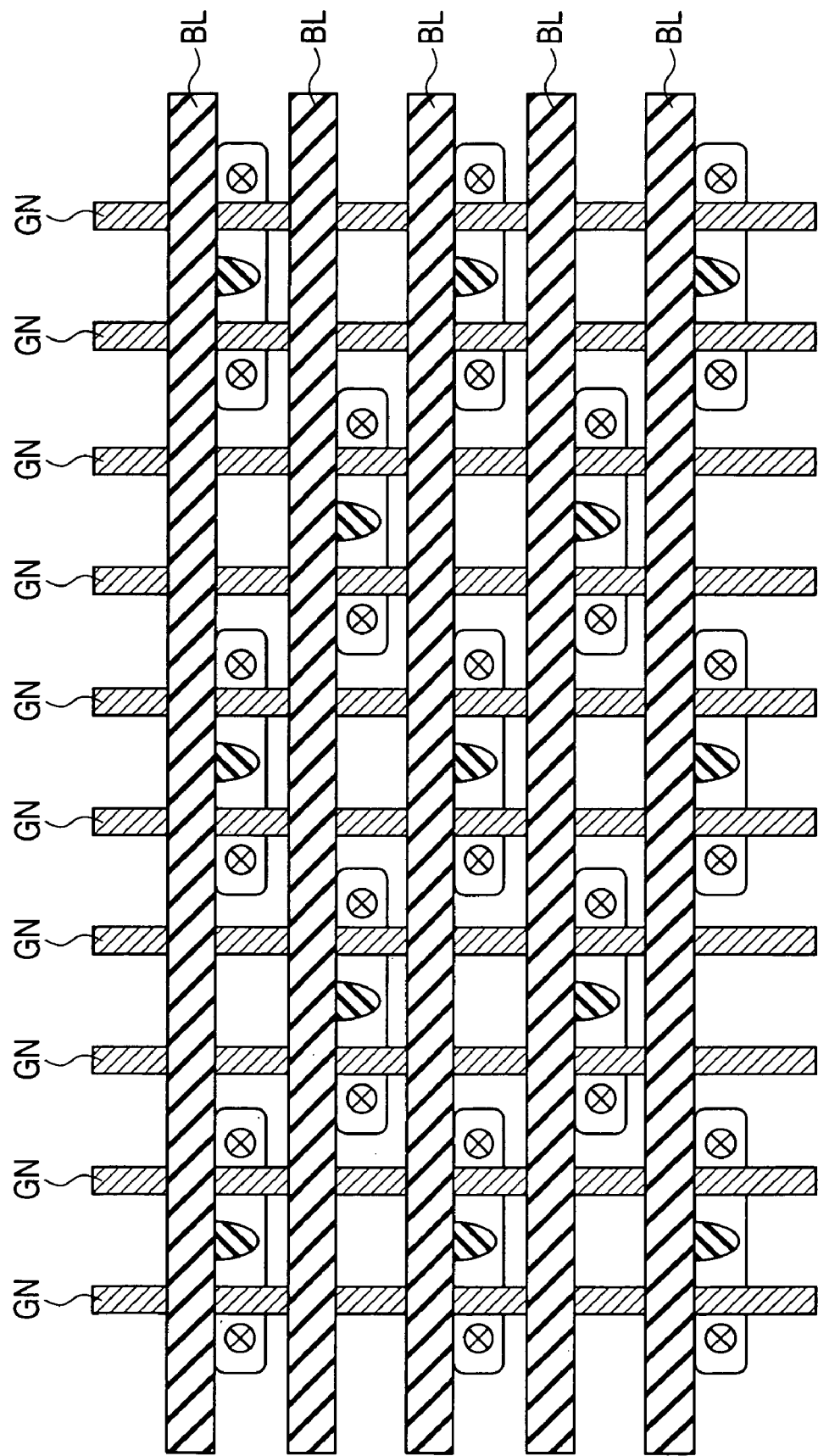
FIG. 29 is another layout view of the major constituent elements of the semiconductor circuit device shown in FIG. 15.
Figure 30:
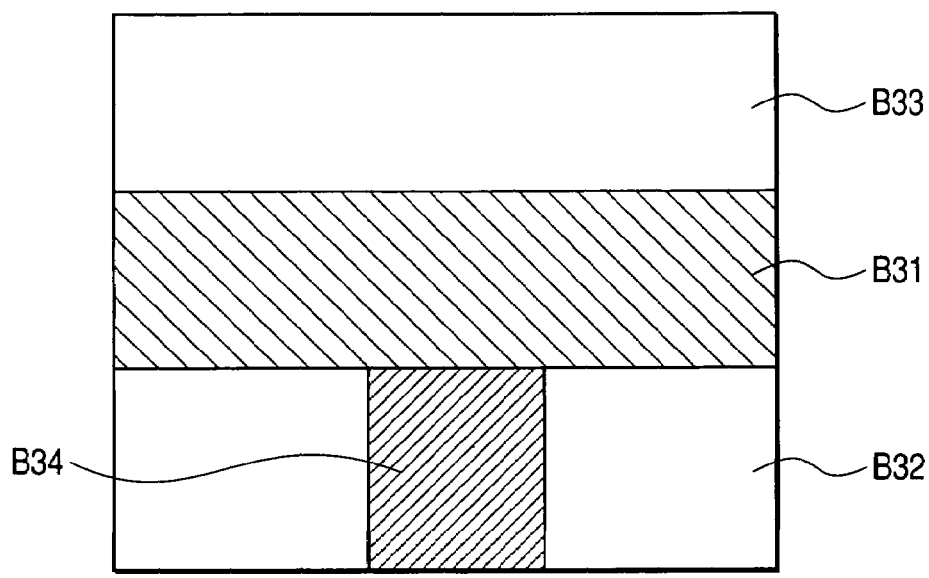
FIG. 30 is a basic structural diagram of a memory cell in a phase change memory.

Also, as shown in FIG. 29, bit lines BL are arranged so that they connect to upper sections of the portions of each bit line contact BC that take a convex shape with respect to the Y-direction of each n-channel MISFET active region. Needless to say, the active regions L shown in FIGS. 28, 29 are arranged periodically in the memory cell region. The gate electrodes GN used as the word lines shown in FIGS. 28 and 29 are continuous in parallel to one another in the memory cell region. That is to say, the gate electrodes GN are, of course, arranged in an X-direction. Also, the bit lines shown in FIGS. 28 and 29 are continuous in parallel to one another in the memory cell region. That is to say, the bit lines are, of course, arranged in the Y-direction.

In accordance with its manufacturing processes, the semiconductor integrated circuit device of the present embodiment will now be described in detail referring to FIGS. 16 to 27. In all figures shown to describe the present embodiment, the same reference number is assigned to constituent elements having the same function, and repeated description of these elements is omitted. First, MISFET is formed using a well-known method. A semiconductor substrate B1 is formed of, for example, an electroconductive p-type silicon monocrystal layer. Also, in a logic circuit region "lgc" and memory cell region "mmry" of the semiconductor substrate B1, a p-well B2 is formed using a well-known method. In addition, in the logic circuit region "lgc" of the semiconductor substrate B1, an n-well B2a is formed using a well-known method. On an upper-layer section of the semiconductor substrate B1, element isolation regions B3, B3*a*, B3*b* of a shallow trench embedded type are formed using a well-known method. The regions partitioned by these element isolation regions (dielectric films B3, B3*a*, B3*b*) are the so-called active regions, and elements and others are formed in part of these regions. Gate dielectric films B4 on the semiconductor substrate B1 are each made of, for example, a silicon oxynitride, and each film B4 has a thickness set to range from about 1.5 to 10.0 nm, for example.

Figure 16:
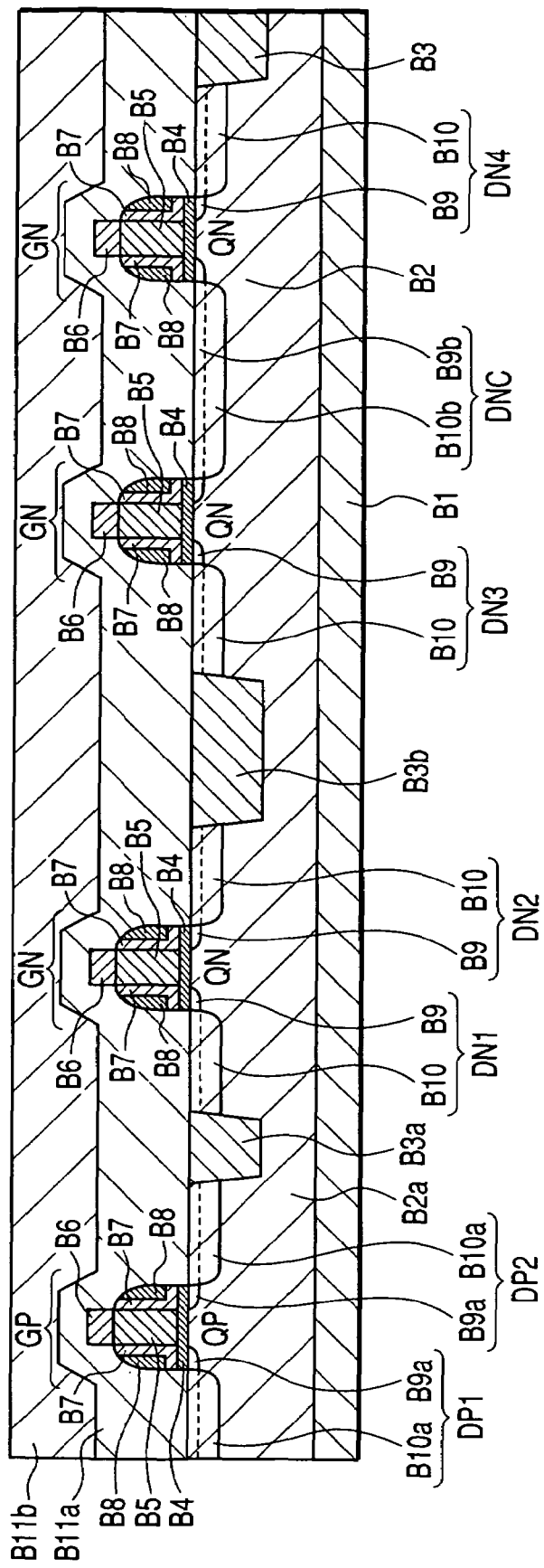
FIG. 16 is a sectional view of major constituent elements of a substrate in certain manufacturing process steps for the semiconductor circuit device shown in FIG. 15.
Figure 17:
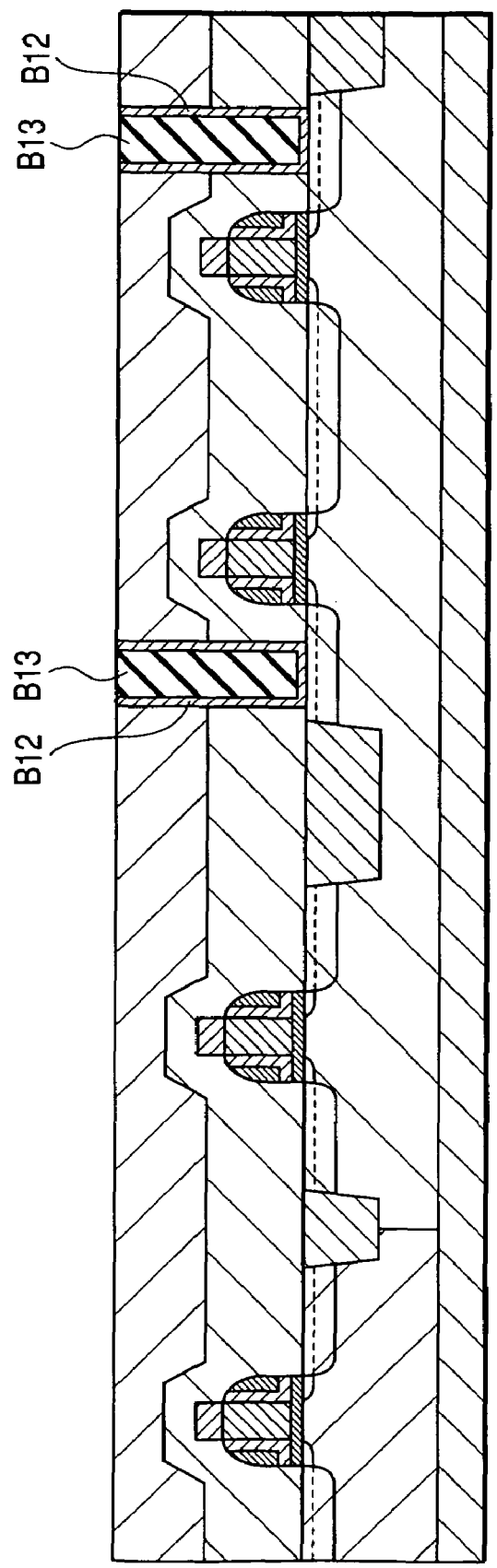
FIG. 17 is a sectional view of the major constituent elements of the substrate in additional manufacturing process steps for the semiconductor circuit device shown in FIG. 15.

Next, an n-type polycrystal silicon film B5 and a p-type polycrystal silicon film B5*a* are formed using a well-known method. This is followed by forming an n-channel MISFET LDD active region B9 and a p-channel MISFET LDD active region B9*a* using a well-known method. This is further followed by forming a sidewall spacer B7 made of, for example, a silicon oxide film, and a sidewall spacer B8 made of, for example, a silicon nitride film, by use of a well-known method. After this, an n-channel MISFET LDD active region B10, a p-channel MISFET LDD active region B10*a*, an n-type polycrystal salicide film B6, and a p-type polycrystal salicide film B6*a* are formed using a well-known method. This is followed by forming interlayer dielectric films B11*a*, B11*b*, by use of a well-known method. In this way, MISFET salicide gate electrode structures GN, GP, diffusion layer regions DN, DNC, DP, sidewall spacers B7, B8, and interlayer dielectric films B11*a*, B11*b*, by use of well-known methods. The interlayer dielectric film B11*b* has an upper face formed evenly so that its height is approximately the same in the memory region and the logic region. This state is shown in FIG. 16.

Figure 18:
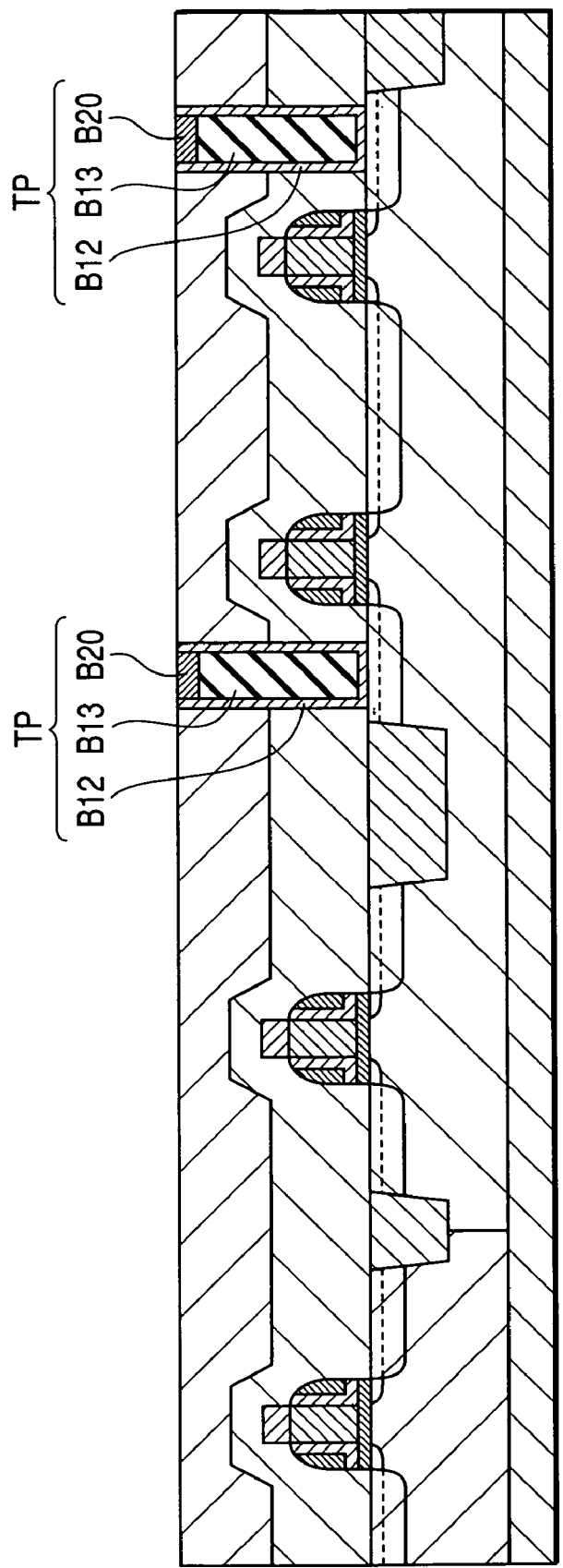
FIG. 18 is a sectional view of the major constituent elements of the substrate in further additional manufacturing process steps for the semiconductor circuit device shown in FIG. 15.

Next, a photoresist for connection hole forming in the memory cell region is formed on the interlayer dielectric film B11*b*, and with the photoresist as an etching mask, the interlayer dielectric films B11*a*, B11*b* are each pierced to form such a connection hole (see FIG. 17) that exposes an upper face of a semiconductor region QN of a memory cell section n-type MISFET QM. Next after removal of photoresist patterns, a barrier metal B12 made of, for example, a titanium film and a titanium nitride film is formed by depositing these films in order from a lower layer by use of a sputtering method. Tungsten B13, for example, is stacked on these deposited films using a method such as CVD, whereby the connection hole is filled in. After this, an upper portion of the interlayer dielectric film B11*b* is exposed using a well-known CMP method. Next, 20 nm, for example, of the tungsten B13 embedded in this contact hole is etched back. After this, a high-resistance metal B20 made of, for example, a titanium film and a titanium nitride film is formed by depositing these films in order from a lower layer by use of a method such as sputtering. The contact hole is thus filled in. Next, a memory cell lower contact electrode TP is completely isolated using a known-well CMP method. FIG. 18 shows the isolated state.

Although, in the present embodiment, the memory cell lower contact electrode hole is filled in using the high-resistance metal B20, a metal of high CMP planarity may be used instead so that the memory cell lower contact electrode has a planar upper face. For example, molybdenum (Mo) of a small crystal grain size can be used as the metal. Metals of high CMP planarity have a suppression effect against local phase changes due to the electric field concentration occurring at rough sections of a contact metal. Uniformity in electrical characteristics of memory cell elements, cyclic rewriting reliability, and high-temperature-resistant operational characteristics improve as a result.

Figure 19:
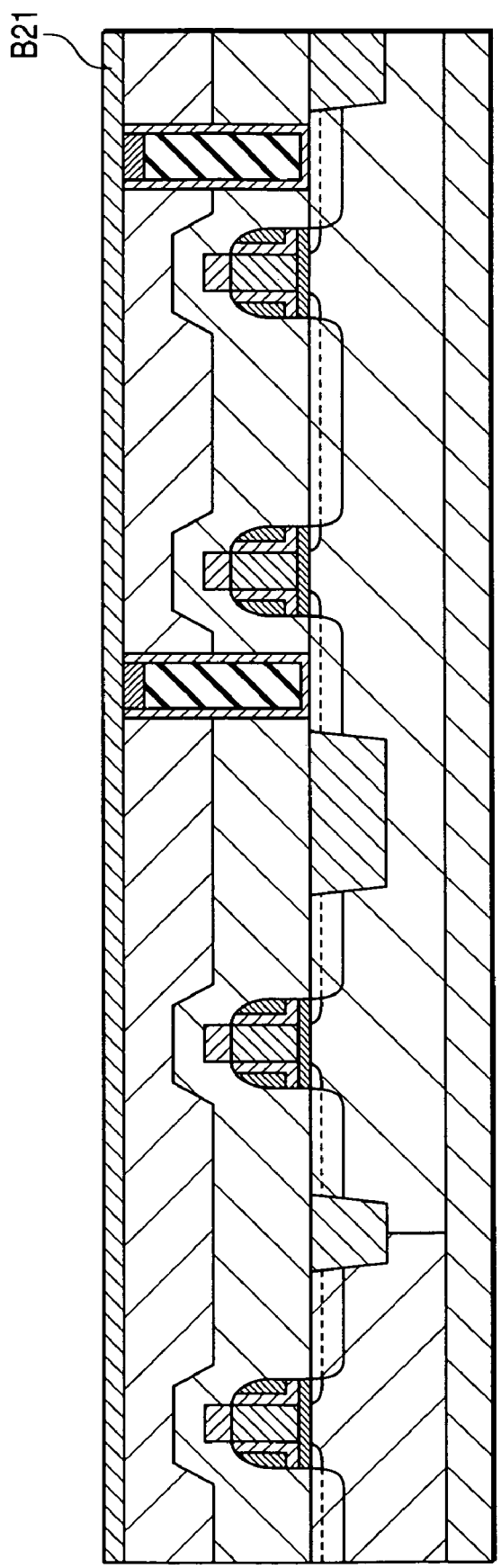
FIG. 19 is a sectional view of the major constituent elements of the substrate in still further additional manufacturing processes for the semiconductor circuit device shown in FIG. 15.
Figure 20:
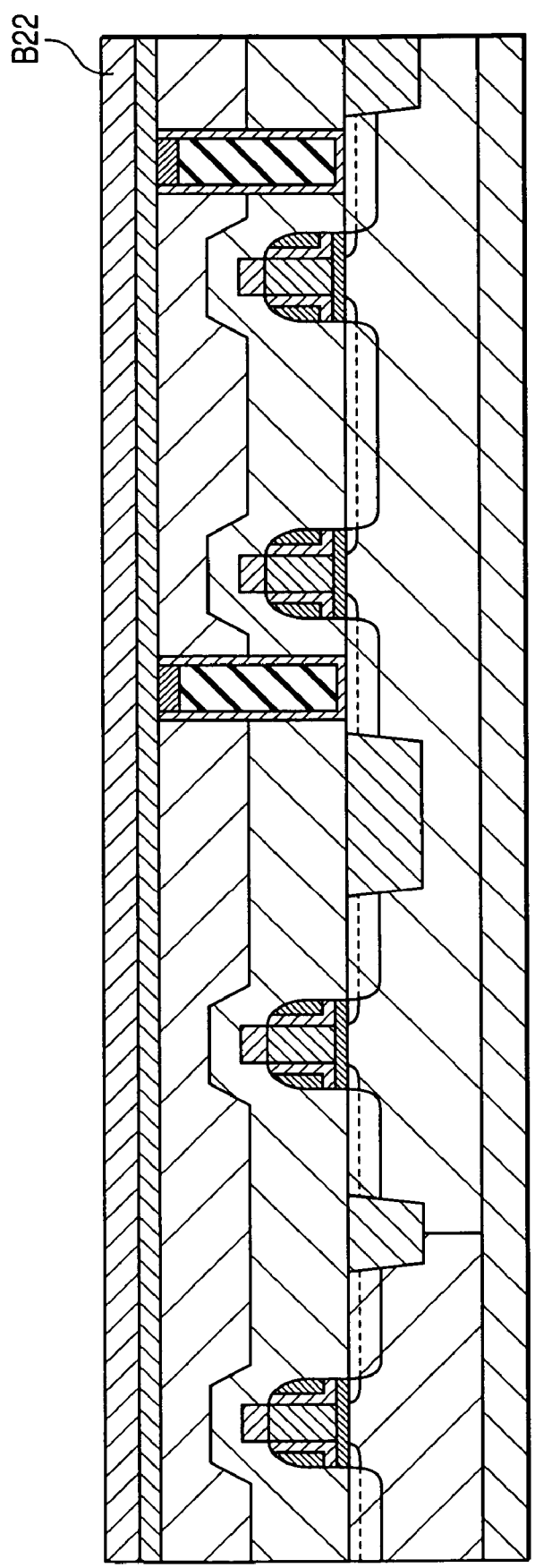
FIG. 20 is a sectional view of the major constituent elements of the substrate in still further additional manufacturing processes for the semiconductor circuit device shown in FIG. 15.
Figure 21:
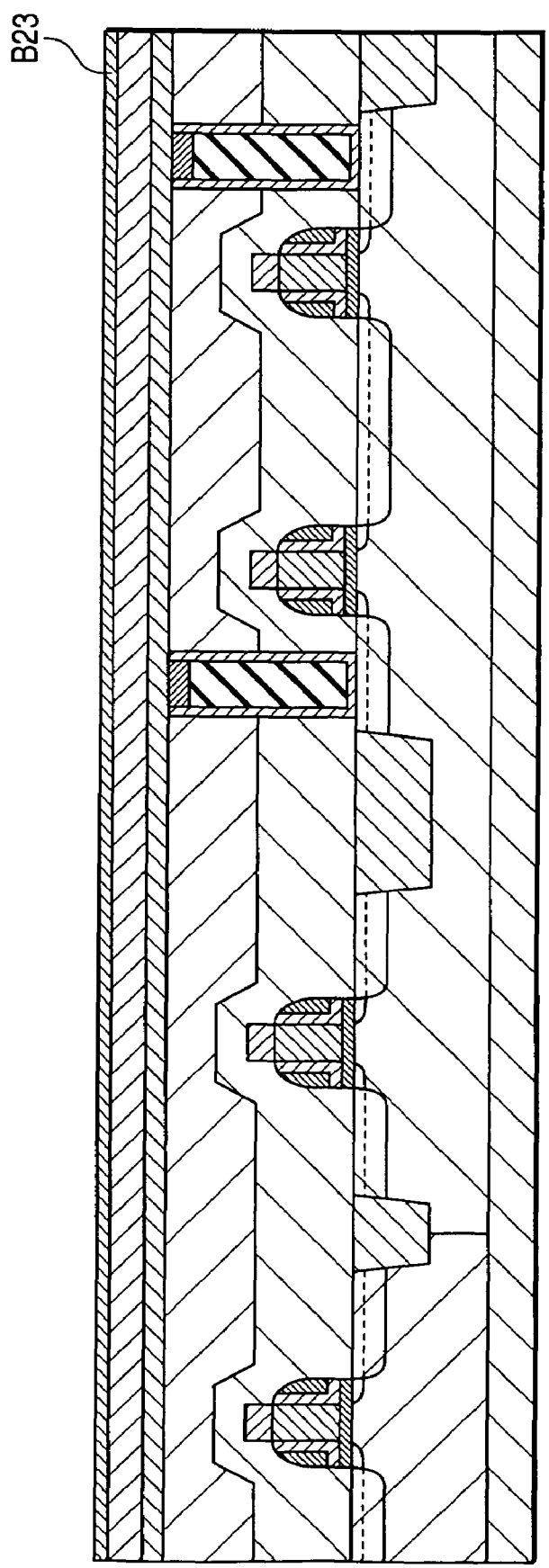
FIG. 21 is a sectional view of the major constituent elements of the substrate in still further additional manufacturing processes for the semiconductor circuit device shown in FIG. 15.
Figure 22:
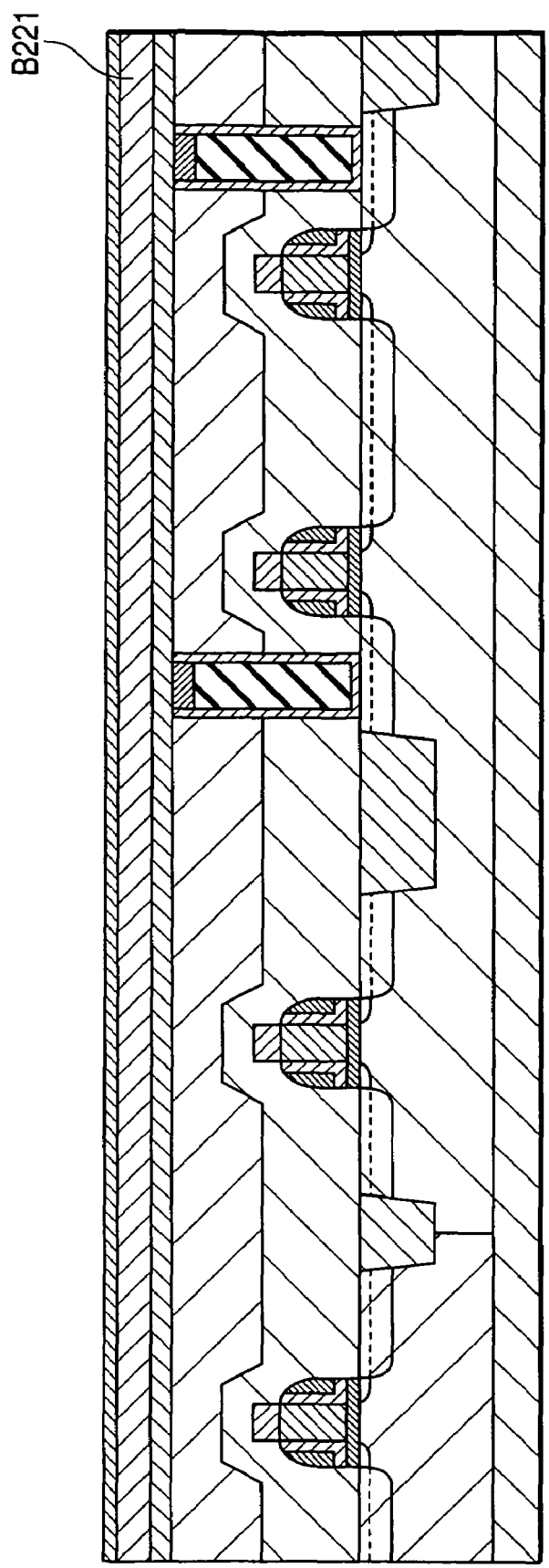
FIG. 22 is a sectional view of major constituent elements of a substrate in certain manufacturing processes for the semiconductor circuit device shown in FIG. 1.
Figure 23:
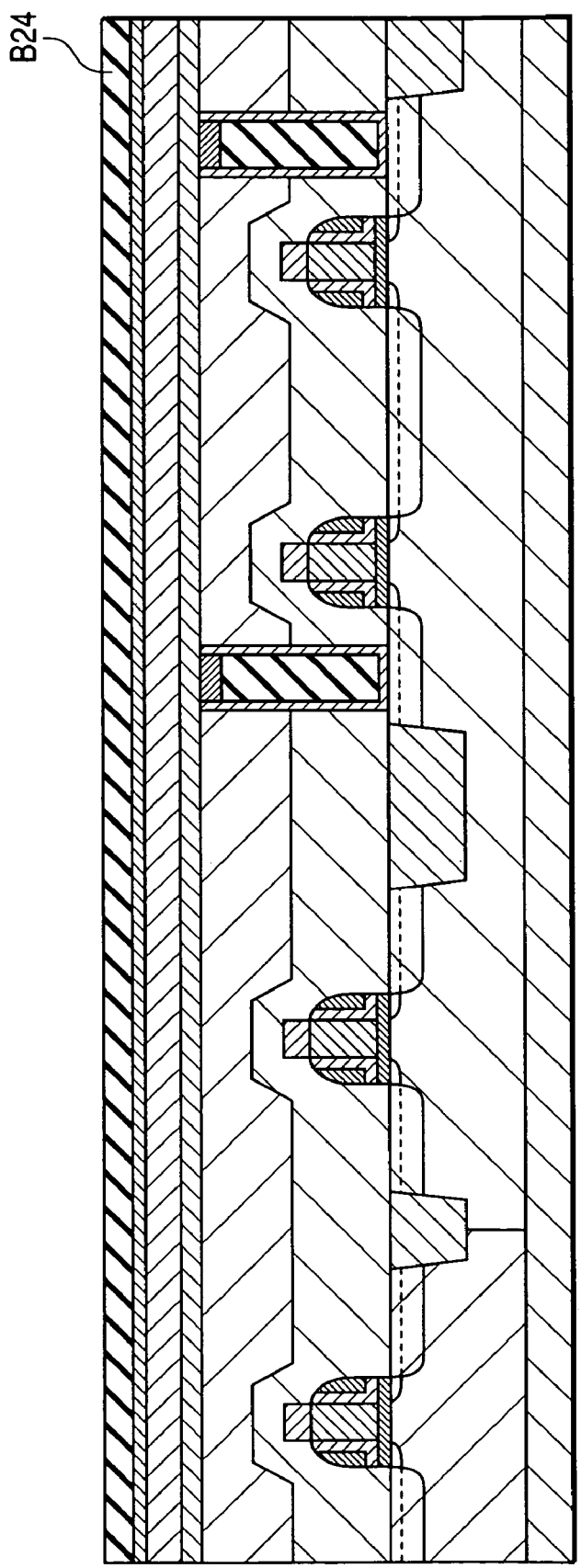
FIG. 23 is a sectional view of the major constituent elements of the substrate in still further additional manufacturing processes for the semiconductor circuit device shown in FIG. 15.
Figure 24:
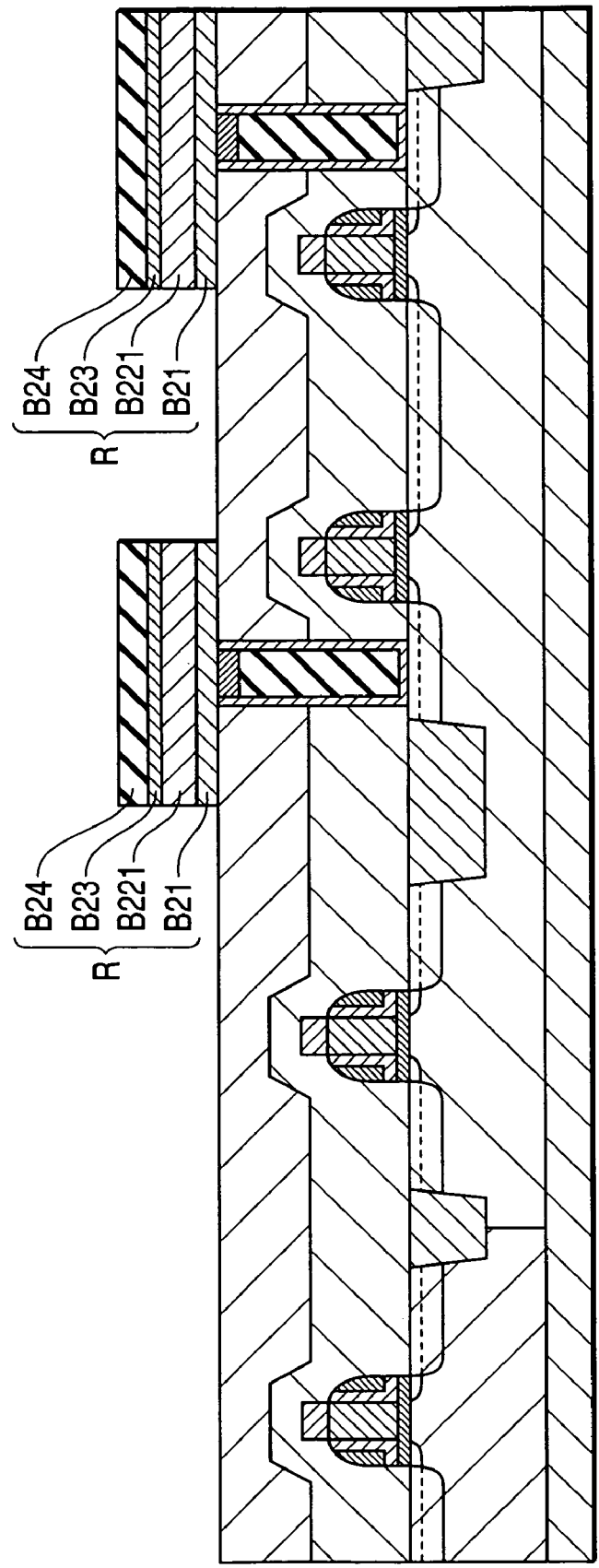
FIG. 24 is a sectional view of the major constituent elements of the substrate in still further additional manufacturing processes for the semiconductor circuit device shown in FIG. 15.
Figure 25:
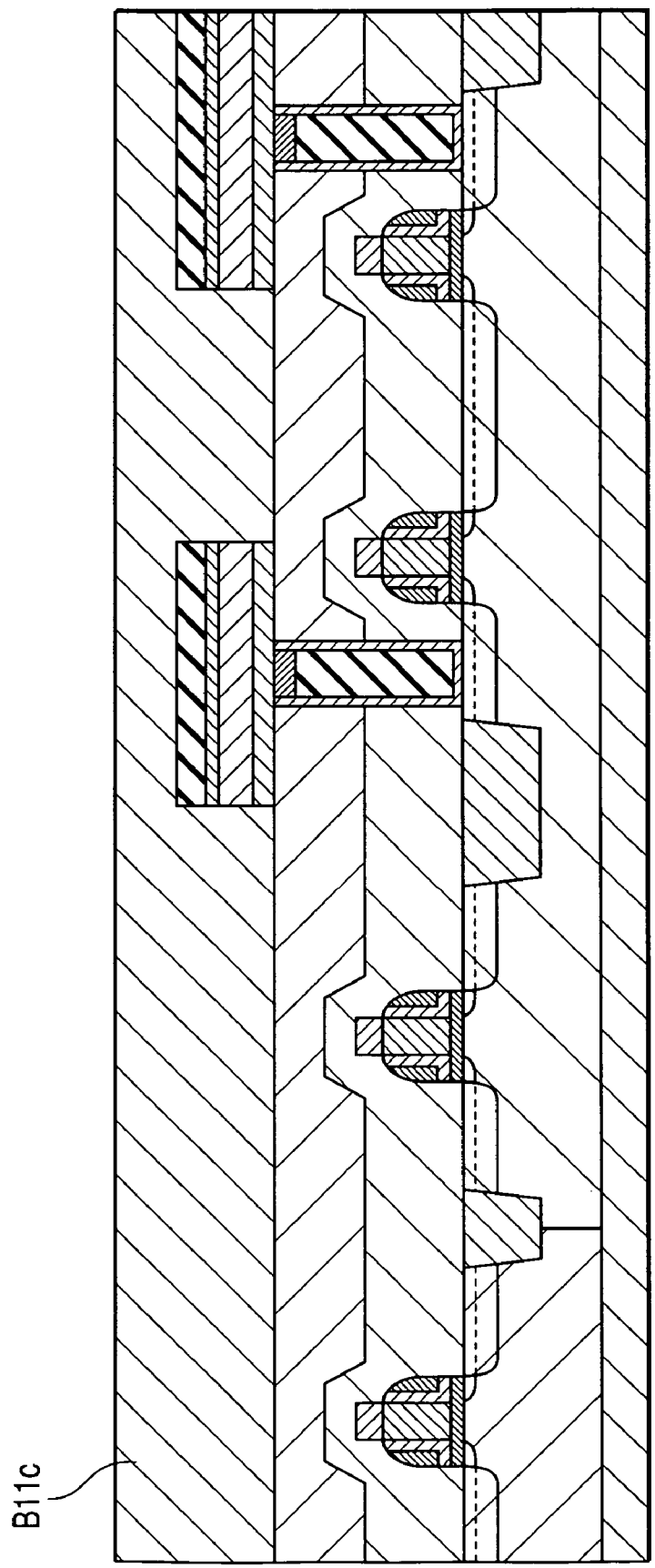
FIG. 25 is a sectional view of the major constituent elements of the substrate in still further additional manufacturing processes for the semiconductor circuit device shown in FIG. 15.
Figure 26:
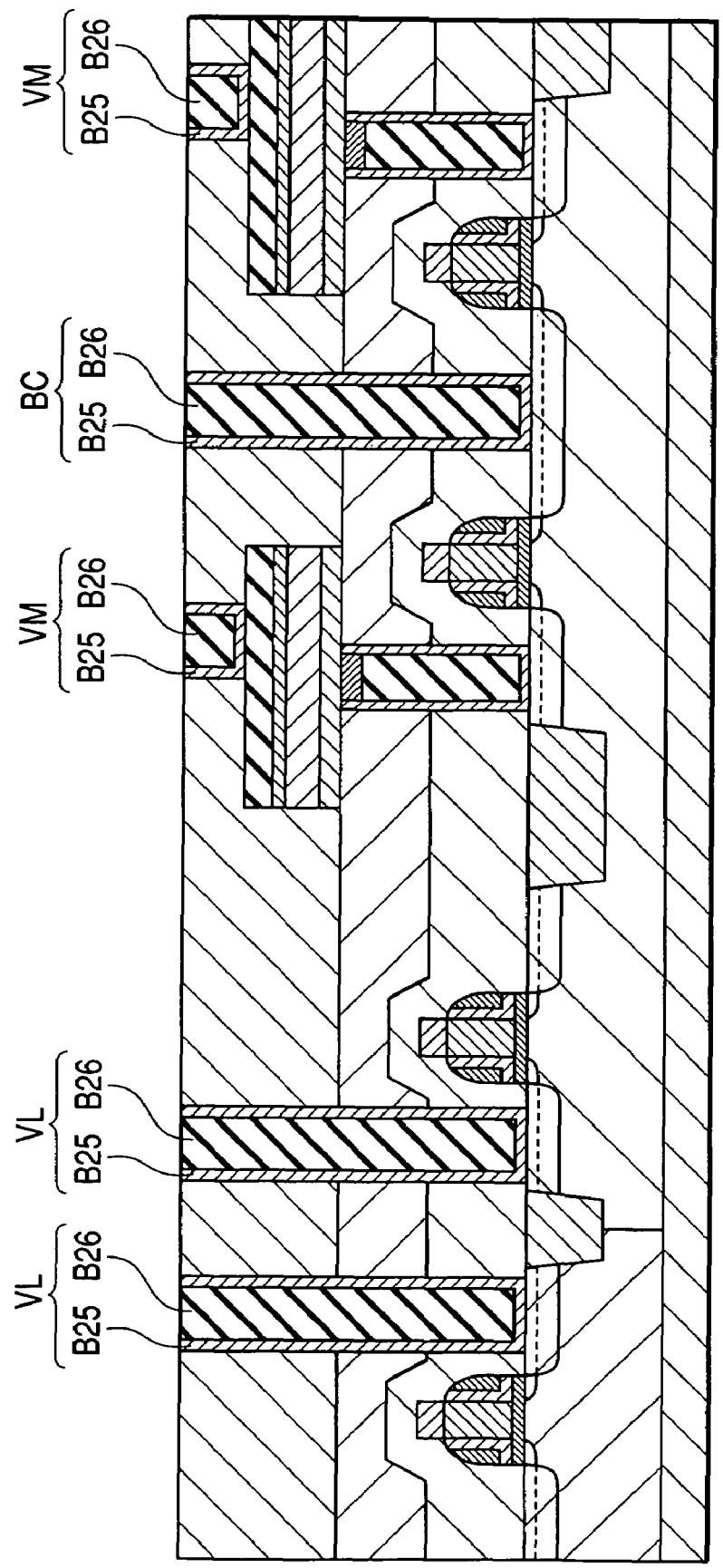
FIG. 26 is a sectional view of the major constituent elements of the substrate in still further additional manufacturing processes for the semiconductor circuit device shown in FIG. 15.
Figure 27:
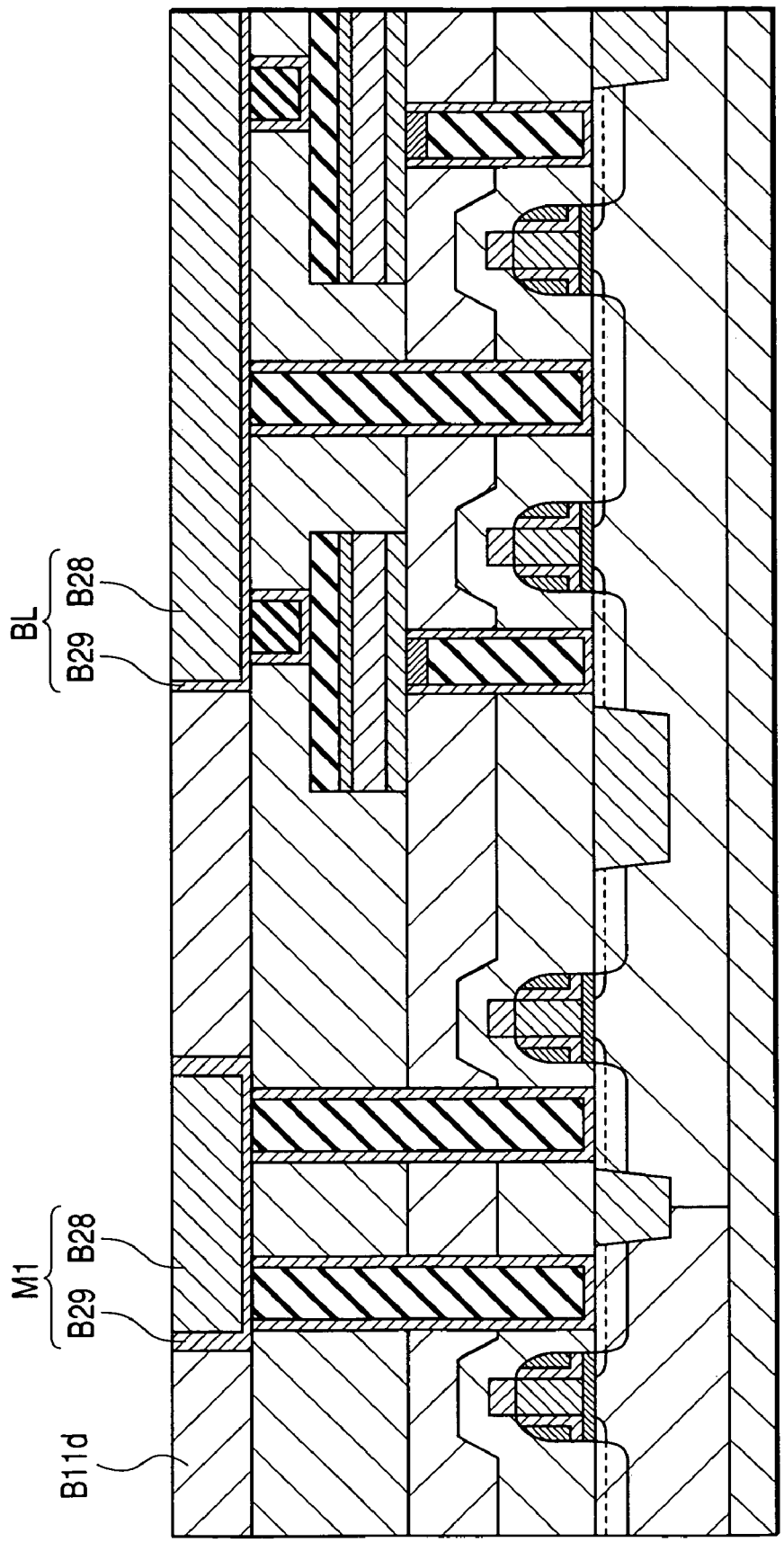
FIG. 27 is a sectional view of the major constituent elements of the substrate in still further additional manufacturing processes for the semiconductor circuit device shown in FIG. 15.

Also, the memory cell lower contact electrode TP may use a thin dielectric film on its upper face. This film can be, for example, a silicon oxide, a silicon nitride, a germanium oxide, or an aluminum oxide. Alternatively, tungsten B13, for example, may be oxidized or nitrided to form a tungsten oxide or a tungsten nitride, respectively, so that the upper face of the memory cell lower contact electrode TP exhibits high resistance. After this, depositing a phase-change material antipeeling film B21 made of a silicon nitride, for example, results in such a state as shown in FIG. 19. Further depositing a phase change material B22 creates such a state as shown in FIG. 20. This phase change material assumes a film thickness of 100 nm. Next depositing a metal film B23 made of, for example, tungsten, creates such a state as shown in FIG. 21. Further forming an anneal-crystallized phase change material M27 by emitting laser light from an upper face of the metal film B23 creates such a state as shown in FIG. 22.

Figure 32:
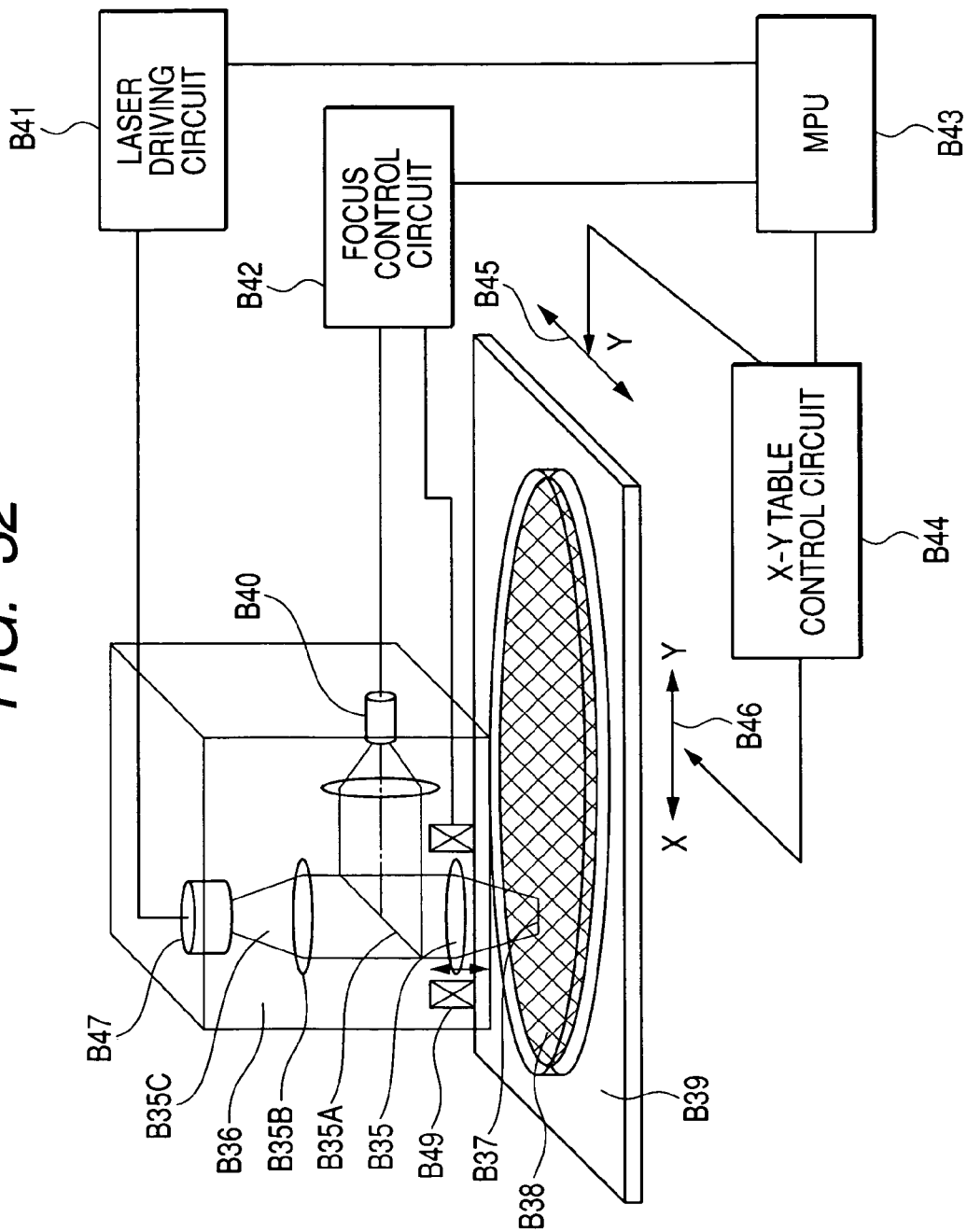
FIG. 32 is a schematic diagram showing an example of a laser crystallization apparatus.

FIG. 32 is a schematic view of a laser crystallizing apparatus that is used above. A laser head B36 includes a high-power semiconductor laser B47 as a light source, collimator lenses B35B, a PBS B35A, an objective lens B35 for converging laser light, an actuator B49 for moving the objective lens B35 in optical-axis direction B5C, and a focus detector B40 that detects a focal point at which the laser light is converged by the objective lens B35. A wafer tray B39 for mounting a disc-shaped silicon wafer B38 is formed in recessed form with a diameter slightly greater than that of the silicon wafer B38, and is disposed so as to be orthogonal to optical axis B5C of the laser light that passes through the objective lens B35. The wafer tray B39 can be freely moved two-dimensionally in X-axis direction B46 and Y-axis direction B45 while maintaining a perpendicular position with respect to the above optical axis.

A laser driving circuit B41 can emit laser light and has a laser pulse driving capability with a frequency from 1 Hz to 10 MHz and a pulse width from 100 ns to 1 s. This circuit can also be driven on DC power. In addition, peak power and bottom power of laser pulsed light are arbitrarily settable. A focus control circuit B42 has a feedback control function that corrects focusing errors by driving the actuator B49 according to the out-of-focus signal detected by the focus detector B40. An X-Y table control circuit B44 can drive the wafer tray B39 along a two-dimensional plane in the X-axis direction B46 and the Y-axis direction B45, and is adapted to allow the wafer tray B39 to be moved at any speed and to any position, in the X-, Y-directions. Microprocessor (MPU) B43 is connected to major sections, namely, the laser driving circuit B41, the X-Y table control circuit B44, a signal processing circuit B48, the focus control circuit B42, and a head driving circuit (not shown). The MPU B43 is designed so as to operate as preprogrammed, and can control all major sections at the same time. When high laser power density is unnecessary, laser light does not need converging by the objective lens or the like and may be parallel light. In addition, the kind of light source is not limited to a semiconductor laser and may be a YAG laser, a $CO_2$ laser, or any other suitable solid-state laser or gas laser. Flash light from a xenon flash lamp may be converged via a reflecting mirror or the like before emission.

Figure 33A:
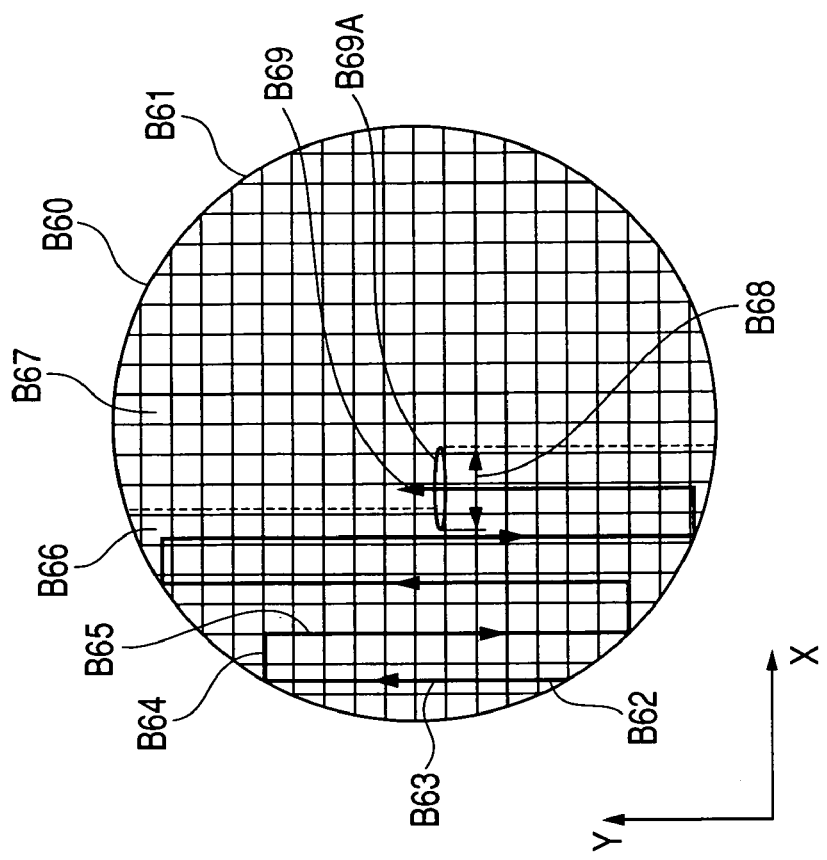
FIGS. 33A and 33B are diagrams that explain scanning with a laser beam.
Figure 33B:
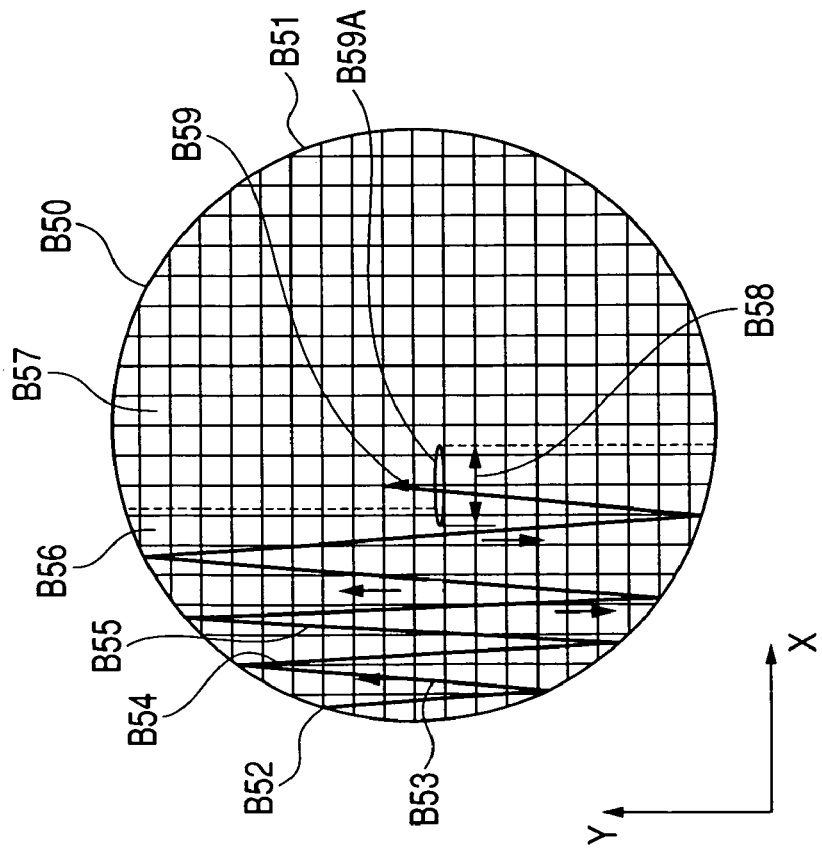

FIGS. 33A and 33B illustrate on-wafer laser beam scanning. FIG. 33A is a diagram illustrating a scheme of linearly scanning a stage at a constant rate only in the X-direction while repeating continuous reflection of a laser beam in longitudinal and perpendicular directions of a spot, that is, in a longitudinal direction of the paper. At this time, a path of a central point of the beam always bends at the same angle. The beam spot bends immediately after arriving at an end of a crystallization region on the wafer. When the entire optical head is driven, however, the path bends with slight roundness, not sharply in completely linear form, because of great inertia. Speed and bending positions are predetermined to ensure that the beam spot (range up to $1/e^2$ of maximum power) always passes through all points in the crystallization region on the wafer at least one time. FIG. 33B shows the path that the central point of the beam takes when the optical head and the X-stage are actuated in an alternate fashion for on-wafer scanning with the beam spot. FIG. 33B is a view of a silicon wafer B50 in a crystallization process when the wafer is seen from the laser head B36, and in this view, a horizontal direction is taken as an X-axis, and a vertical direction, as a Y-axis. The crystallization at a given time is shown in FIGS. 33A, 33B, wherein the laser spot B59A, B69A moves in Y-direction B59, B69 and a left half of the silicon wafer B50 is a crystallized section B56 and a right half is an uncrystallized section B57. Initially, the laser spot B59, B69 is positioned at B52, B62. Laser light is emitted at a required pulse frequency and with required output, and focus is controlled. The laser head is moved in the Y-direction for the silicon wafer B50 to be scanned in direction B53 with the laser spot while being crystallized. When the laser spot arrives at an edge of the silicon wafer B50, the movement of the laser head in the Y-direction is stopped and the silicon wafer B50 is moved in X-direction B54 through a distance shorter than laser spot width B58. After this, the laser head is moved in Y-direction B55. The entire surface of the silicon wafer B50 can be crystallized by repeating the above steps and scanning the wafer from a left face thereof with the laser spot so as not to allow uncrystallization clearances to occur. The silicon wafer itself may be moved in lieu of the laser head. Crystallization with a laser spot area of $10^{-6}$ cm$^2$ or more and up to $10^{-3}$ cm$^2$, and a pulse width (passing time of the spot in the range up to $1/e^2$ of its maximum power) from 100 ns to 1 s, was confirmed in the present embodiment.

The linear-scanning laser crystallizing apparatus illustrated in FIG. 32 is constructed so that the laser head B36 moves in the Y-direction and so that the silicon wafer B38 mounted on the wafer tray B39 moves in the X-direction. The crystallizing apparatus, however, is not always limited to this type and may have a laser head X-Y plane moving mechanism (not shown) that moves the laser head B39 in both X-axis and Y-axis directions to crystallize the entire surface of the silicon wafer B50 similarly to laser spot scanning illustrated in FIGS. 33A, 33B. Otherwise, similarly to laser spot scanning illustrated in FIGS. 33A, 33B, the entire surface of the silicon wafer B50 can be crystallized by making the laser head B36 movable only in the X-axis direction and the above-mentioned silicon wafer B38 only in the Y-axis direction or by making the laser head B36 movable only in the Y-axis direction and the above-mentioned silicon wafer B38 only in the X-axis direction.

In the example of FIG. 32, the laser head B36 is disposed above the silicon wafer B38, that is, with a vertical direction as a reference. To provide against dropping dust particles, however, the laser head B36 may be disposed below the silicon wafer B38. Also, a clearance between the silicon wafer B38 and the laser head B36 may be separated by a transparent plate. Additionally, an integrated unit of the silicon wafer B38 and the wafer tray B39 or the entire structure including the laser head B36, the silicon wafer B38, and the wafer tray B39, may be installed inside a vacuum deposition apparatus or set up in a container sealed with a specific gas. The laser head may be installed outside a vacuum region of the vacuum deposition apparatus, and the laser beam may be introduced into the vacuum region.

After laser crystallization of the wafer in the above manner, a longitudinally elongated crystal with a width smaller than its film thickness of 100 nm, that is, with a width of about 20-50 nm, was observed through a transmission electron microscope. The width of the crystal in this case is smaller than about 80 nm, a width of the lower electrode. As detailed later herein, therefore, a favorable device can be obtained without a variation in element characteristics according to a particular relationship in relative position between the crystal and the lower electrode. After that, layered deposition of a metal film B24 made of, for example, tungsten, yields such a state as in FIG. 23. Subsequent processing of a phase-change material anti-peeling film B21, a laser-crystallized phase change material B27, tungsten B23, and tungsten B24, as a resistive element R, yields such a state as in FIG. 24. Further depositing an interlayer dielectric film B11c yields such a state as in FIG. 25. This is followed by lithographic and dry-etching processes. These processes are conducted to form a connection hole in memory cell region "mmry" by piercing the interlayer dielectric film B11c, form additional connection holes in memory cell region "mmry" by piercing interlayer dielectric films B11a, B11b, B11c, form further connection holes in logic circuit region "lgc" by piercing interlayer dielectric films B11a, B11b, B11c, and deposit a barrier metal B25 first and then tungsten B26. Next, each such connection hole is filled in and the interlayer dielectric film B11c is processed to have an exposed upper face, etching-back is provided for upper faces of the tungsten B26 within the hole and the interlayer dielectric film B11c to be flush with each other. After this, the upper electrode contact VM in the memory cell region, the bit line contact BC in the memory cell region, and the via electrode contact VL in the logic circuit region are completely isolated from one another. This creates such a state as in FIG. 26. Next after deposition of a dielectric film B11c made of, for example, a silicon oxide, a logic circuit first layer electrical interconnect and a photoresist for forming bit lines are formed on the interlayer dielectric film B11c, and with the photoresist as an etching mask, a logic circuit first layer electrical interconnect trench and a bit line trench are formed such that the interlayer dielectric film B11c has an exposed upper face. Next, a barrier metal B29 made of, for example, a titanium film and a titanium nitride film, is formed by depositing these films in order from a lower layer by use of a sputtering method or the like. A conductor film is formed by stacking, for example, a tungsten film B28 on the above-deposited films by use of a method such as CVD. Next, the conductor film is etched back using a known CMP method in order for the upper face of the interlayer dielectric film B11c to be exposed and for the bit line BL in the trench and the upper face of the first layer electrical interconnect M1 to be flush. Complete isolation of the bit line BL and the first layer electrical interconnect M1 creates such a state as in FIG. 27. At an upper portion of the electrical interconnect M1 and that of the electrical interconnect layer of the bit line BL, a plurality of electrical interconnect layers are formed using a known method. However, these layers are not shown.

A semiconductor memory device is completed after 400° C.-450° C. hydrogen annealing with a well-known method. The relationship between the materials and preparation conditions, and memory characteristics of the above memory is discussed below. A ratio between a maximum width of a contact section of the electrode smaller in the maximum width of its contact section in a region in contact with a chalcogenide film, and the average width of crystal grains, obtained when the film was cut in parallel to the film surface, was varied to obtain the following results. The average width of the film in sections parallel to the film surface of the crystal grains was defined as the average width value obtained centrally in a thickness direction of the film when a total of 20 pieces, 10 in each of left and right directions from any central point, likely to be identifiable as crystal grains in terms of contrast were selected from the sectional TEM photo shown as an example in FIG. 34.

Initially, when a reset pulse is applied, the chalcogenide film closer to the electrode smaller in the maximum width of the contact section is heated by electric current and becomes fused. The heated film is rapidly quenched to become amorphized. The crystal that has been formed by laser crystallization using the above method, however, remains intact at periphery. In addition, since its fusion time is very short, the atomic arrangement existing in the amorphized region is not completely disturbed and a history of the past slightly remains. When a set pulse is next applied, therefore, the electric current has its path affected by a crystal grain boundary, whereby a shape of the crystal grains when they were laser-crystallized is affected (see Table 1).

TABLE 1

| Ave. width of crystal grains:Max. width of contact section | Difference in set resistance average value between elements |
|---|---|
| 1.5:1 | 10 (1-digit) |
| 1.2:1 | 3 |
| 1:1 | 0.3 |
| 0.8:1 | 0.1 |
| 0.5:1 | 0.1 |

That is to say, the phase change memory needs to have a base substance, a first electrode formed on the base substance, a chalcogenide film formed on the first electrode and capable of recording information by causing reversible phase changes between a crystal phase and an amorphous phase, and a second electrode formed on the chalcogenide film. The average width of the film when it is cut in parallel to the film surface of the crystal grains needs to be smaller than the maximum width of the electrode whose contact region with respect to the chalcogenide film is the smaller of the electrodes at both sides of the film in terms of maximum width.

Figure 34:
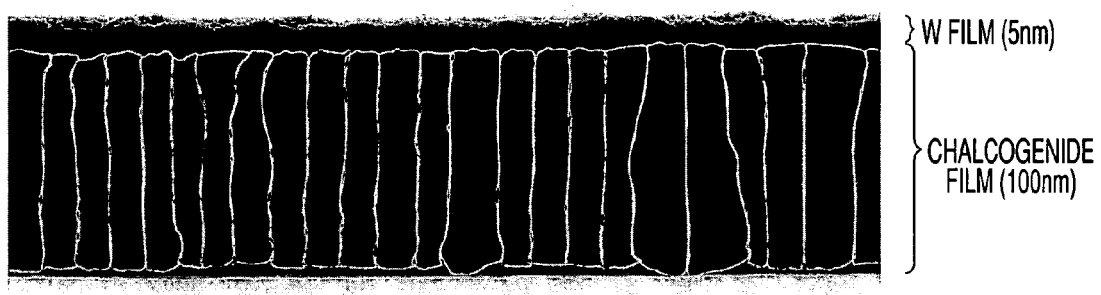
FIG. 34 is a diagram (photo) showing the crystal grains formed in a chalcogenide film in the first embodiment of the present invention.
Figure 35:
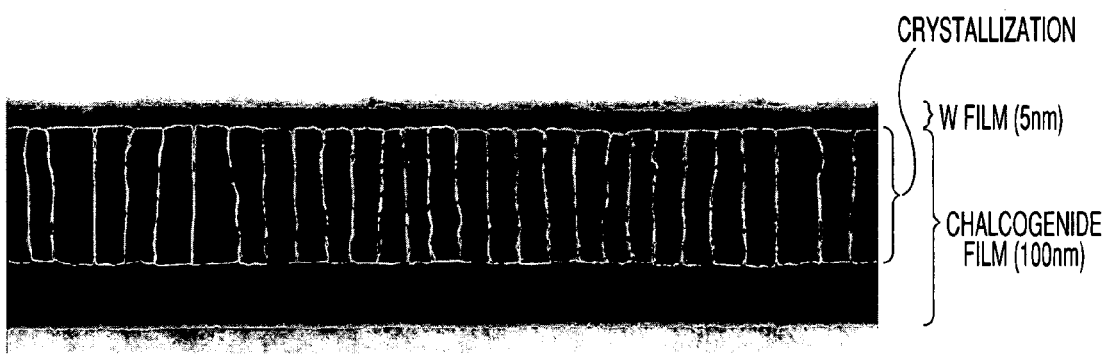
FIG. 35 is a diagram (photo) showing the crystal grains formed down to midway positions in a film thickness direction of the chalcogenide film in the first embodiment of the present invention.

When judged from such a sectional transmission electron microscopic photo as in FIG. 34, the average width in sections parallel to the film surface of the crystal grains of the above 100-nm-thick chalcogenide film (i.e., the average width of any 20 crystal grains adjacent to one another) was smaller than the average width of the film in a vertical direction (film thickness direction) with respect to the film surface. The average width in sections parallel to the film surface of the crystal grains is about 20 nm. Although the formation of columnar crystal grains can occur even during normal annealing, individual columns are thicker than those formed by laser crystallization. During laser light irradiation, since the chalcogenide film is large in extinction coefficient, absorption occurs mainly near the surface of the light-incident side of the film and the resulting heat conduction increases the internal temperature of the film in sequence. This is considered to make it easy for the crystal to grow in the vertical direction with respect to the film surface. The crystal grains do not need to reach both interfacial regions of the film. It is estimated, for example, from the photo of FIG. 34 that the crystal grains started growing from the interfacial region at the incident side of the light and stopped growing immediately before reaching the interfacial region at the opposite side. A leading end of the crystal grains is seemingly round or polygonal at the section where they stopped growing. An example of crystallization from the incident side of light to substantially a half of film thickness with reduced laser power is shown in FIG. 35.

Figure 36:
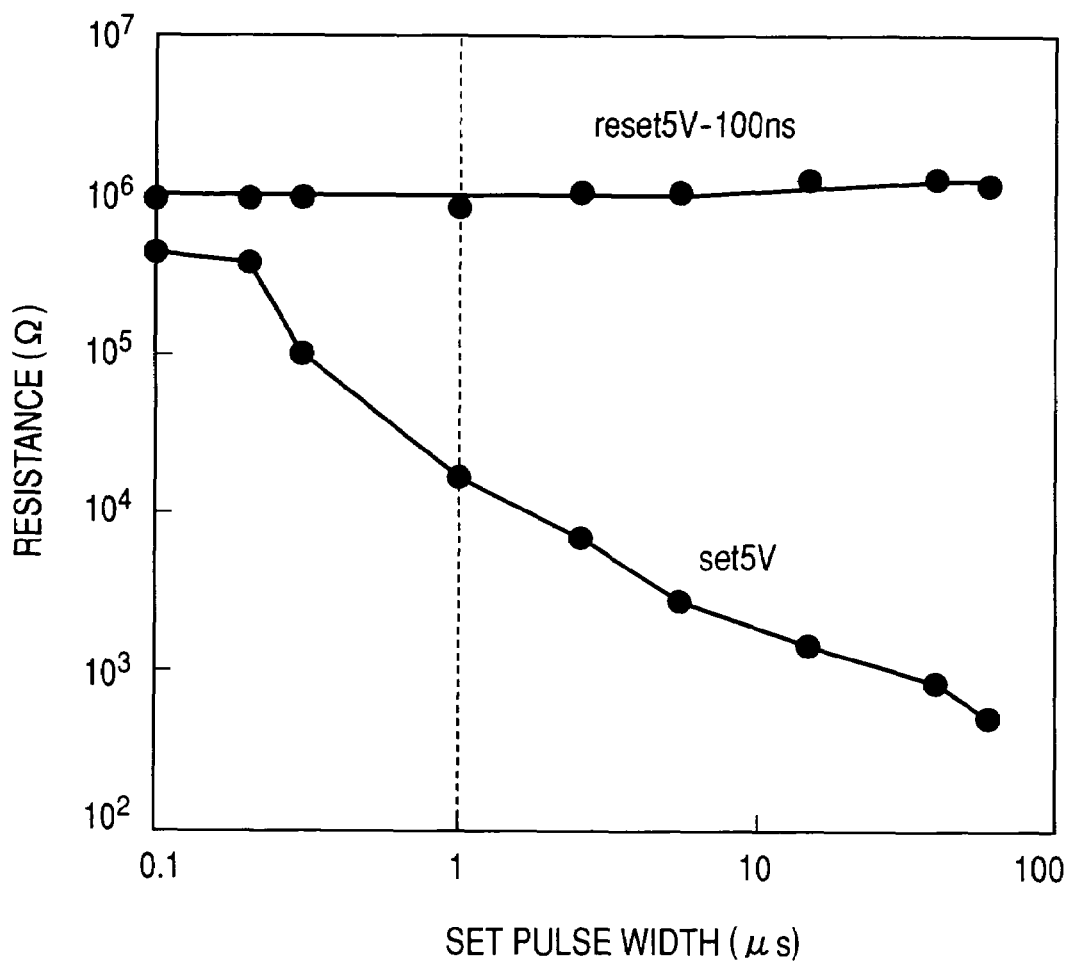
FIG. 36 illustrates the relationship between a set pulse width and resistance value of the phase change memory by way of example.

An example of a relationship between resistance value and set pulse width is shown in FIG. 36. This example applies to a chalcogenide film heavily laden with the nitrogen that is low in crystallization rate. Analyses were performed on changes in the ratio between the average width in sections parallel to the film surface of the crystal grains of the above chalcogenide film (i.e., the average width that was judged from a sectional transmission electron microscopic photo of crystal grains not prone to change in width, but prone to change in height), and the average width of the film in the vertical direction (film thickness direction) with respect to the film surface. As a result, since, as the crystal that was not fused during the application of the reset pulse is longer in the direction of the film thickness, the crystal is crystallized more readily by the action of electric current, the shortest set pulse width changed as in Table 2.

Table 2 below shows the relationship between the ratio between the average width in sections parallel to the film surface of the crystal grains of the chalcogenide film, and the average width of the grains in the vertical direction (film thickness direction) with respect to the film surface, and the shortest set pulse width.

TABLE 2

| Aspect ratio | Shortest set pulse width |
|---|---|
| 1:1 | 1000 ns |
| 1:1.5 | 500 ns |
| 1:2 | 200 ns |
| 1:3 | 100 ns |
| 1:10 | 50 ns |

That is to say, to reduce the difference in characteristics between memory elements to a practical level, it is preferable that the aspect ratio of average width in sections parallel to the film surface of the crystal grains and the grain height should be greater than 1:2. An greater aspect ratio than 1:3 is more preferable. A composition of the chalcogenide film is also important since, even after going through the memory preparation process, the film maintains the required shape of the crystal grains. For example, for a film of a well-known $Ge_2Sb_2Te_5$ composition, the crystal grains obtained after laser crystallization were elongated in a direction of film thickness and sectional aspect ratios were 1:5 or more. Once the film has gone through a 400° C. annealing process, several crystal grains are seemingly merged. The relationship between the composition (in terms of the number of atoms) and the crystal grain size (in a direction parallel to the film surface) after 400° C. annealing, is as shown in following Table 3:

TABLE 3

| Composition | Crystal grain size |
|---|---|
| $Ge_2Sb_2Te_5$ | 90 nm |
| $In_{20}Ge_{15}Sb_{15}Te_{50}$ | 40 nm |
| $Zn_{20}Ge_{15}Sb_{15}Te_{50}$ | 20 nm |
| $Ag_5Ge_{25}Sb_{22}Te_{50}$ | 40 nm |
| $Ge_{20}Sb_{15}Te_{50}N_{15}$ | 50 nm |
| $Ge_{20}Sb_{15}Te_{50}O_{15}$ | 40 nm |

The same results can likewise be obtained by replacing Zn with Cd, a homologous element, or replacing Ag with any other transition metal element such as Co. In terms of addition quantity, the effect of reducing the crystal grain size is observed in a content range from 1 atom-% to 30 atom-%. A more preferable range is from 2 atom-% to 25 atom-%. In the films and others that contain Zn and/or Cd prone to diminish in crystal grain size, the crystal is nucleated centrally in the film and crystal grains not reaching both interfacial regions are present in great quantities.

The above results are summarized here. Preferably, the above chalcogenide film is formed of a material which is constituted by at least three elements. The three elements refer to at least one element selected from the group consisting of Te and three elements (Ge, Sb, and Bi), and further at least one element selected from the group consisting of Zn, Cd, In, N, and O as transition metal elements, wherein the latter one element includes at least 1 atom-% to 30 atom-% or less. Such composition is preferable since crystal grains of a desired shape are formed and since this shape is almost maintained even after a 400° C. annealing process.

Figure 31:
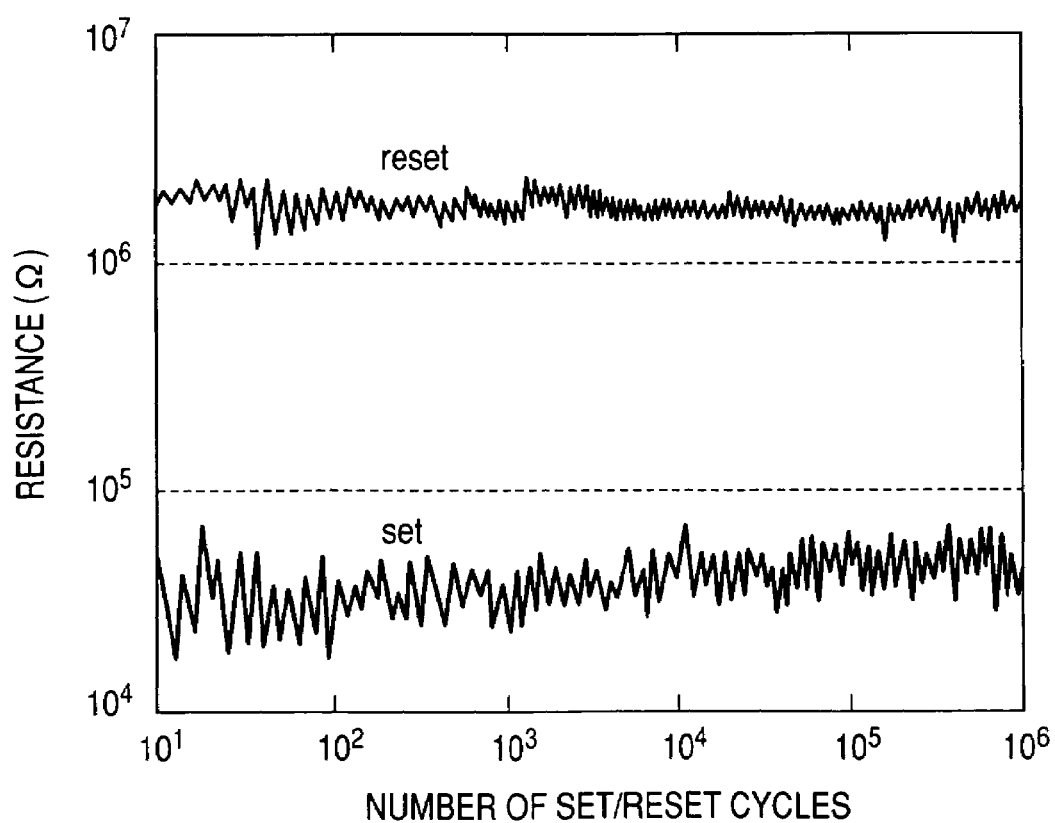
FIG. 31 is a diagram showing an example of cyclic-rewriting characteristics of the phase change memory.

An example of measurements on resistance values of a non-laser-crystallized memory when its contents were cyclically rewritten very often is shown in FIG. 31. The memory was both set and reset at 5 V. FIG. 31 shows the changes observed during the 11th and subsequent rewriting test cycles. During the first to tenth rewriting test cycles, however, a set resistance value decreases by about one order of magnitude from $5 \times 10^5 \Omega$, in a fluctuating fashion. It is necessary to select high enough a laser-heating temperature for minimum dangling bonds and voids and for minimum changes in characteristics during initial rewriting and after repetition of the setting and resetting operations. Laser irradiation is characterized in that film deformation, oxidation, and other adverse effects of temperature rises can be minimized by shortening an irradiation time and a subsequent high-temperature retention time. Even so, it is difficult to completely prevent oxidation. More preferably, therefore, a protective film not prone to obstruct laser heating is formed before laser irradiation. The protective film functions as an interfacial layer after the phase change memory has been completed. This film, therefore, must not be such that it completely interrupts electrical conduction (see Table 4).

TABLE 4

| Existence and material of protective film | Change in resistance value after 10,000 rewrite cycles |
|---|---|
| Absent | 5 times |
| $SiO_2$ | 3 times |
| $Cr_2O_3$ | Twice |
| W | No change |

The same results can likewise be obtained by replacing W with a material, such as $W_{80}Ti_{20}$, that contains W as its principal constituent (exceeding 50 atom-% in content). Therefore, the same protective film as, or a protective film of a composition close to that of, the metal film of the electrode formed on the protective film, is particularly preferable. To ensure a desired advantageous effect and sufficient absorption of light, it is preferable that this layer should have a film thickness of at least 2 nm and up to 20 nm.

Compared with a method of rewriting all elements of a completed memory device a large number of times during its aging, forming a dangling-bond-free or void-free crystal state by creating a high-temperature state by laser irradiation without a deposited film on the phase change film or only with a thin film formed thereon makes defective memory elements less prone to occur, since this method not only saves time but also facilitates relaxation of strains due to volumetric changes. In experiments equivalent to 100 cycles of rewriting of all memory elements during the aging process, rewrite-resistance values reached stability in many of the memory elements. However, since an upper structure was formed in presence of strains and film defects due to the large crystal grain size and thus since electrically energized sections only were heated with the film structure totally remaining relaxed too much to move, a lot of elements suffered destruction or damage or deterioration during in-aging-process rewriting test cycles. That is to say, the phase change memory preferably has a base substance, a first electrode formed on the base substance, a chalcogenide film formed on the first electrode and capable of recording information by causing reversible phase changes between a crystal phase and an amorphous phase, an interfacial layer formed on the chalcogenide film, and a second electrode formed on the interfacial layer.

The following results are obtained when laser light spots to be irradiated are varied in shape and in passing time. During experimentation on spot areas, two kinds of light spots were used and defocusing was included. Experiments indicate that with the smaller of the two types of spots, spot effects up to $10^{-6}$ cm$^2$ at 100 microns×1 micron of a laser of 2-W output can be obtained and that with the larger spot type, spot effects up to about $10^{-3}$ cm$^2$ at 3.5 mm×30 μm of a laser of 60-W output can be obtained. In particular, at $2 \times 10^{-6}$ cm$^2$ or more and up to $10^{-4}$ cm$^2$, resistance value stabilizes from the very first rewriting test cycle, regardless of the aging process conditions used before shipping. Advantageous effects are obtainable, if the irradiation time (the time required for the light spot to pass through any one point on the disk in a range up to $1/e^2$ of peak intensity) is at least 0.1 μs and irradiation power is optimal. With an irradiation time of 1 μs or more, however, partial peeling of interfaces due to heat is difficult to prevent. Preferable characteristics in terms of reproducibility, in particular, can be obtained at 1 μs or more and up to 1 ms. For phase change transistors, laser irradiation onto the chalcogenide film having a memory action can also be conducted similarly and equivalent effects can be obtained.

Summarizing the above results allows one to see that:

(1) Preferable are: a method of manufacturing a phase change memory, wherein the manufacturing method includes the step of forming a first electrode, the step of forming on the first electrode a phase change recording film which records information by causing reversible phase changes between a crystal phase and an amorphous phase, the step of crystallizing the phase change recording film by laser light irradiation under the conditions of $10^{-6}$ cm$^2$ or more and up to $10^{-3}$ cm$^2$ in spot area and 0.1 μs or more and up to 1 s in irradiation time, and the step of forming a second electrode on the phase change recording film, the phase change memory having very small crystal grains in a phase change film.

(2) As described above, according to any one of the first to third embodiments, phase change elements can be crystallized vertically and columnarly with respect to a substrate. In the third embodiment, although it is possible to obtain small crystal grains compared with those obtainable in the first or second embodiment, introduction of laser apparatus and other operations are necessary. In the first and second embodiments, however, since the above can be implemented using ordinary semiconductor-manufacturing apparatus, the above is feasible, even without new apparatus such as laser apparatus. Also, it goes without saying that the first to third embodiments can be used in combination.

The meanings of the reference numbers and symbols used in the drawings accompanying this Application are listed below.

A1 . . . Substrate
A2 . . . Chalcogenide layer (columnar "hcp" crystal)
A3 . . . Chalcogenide layer (inclined "hcp" crystal)
A4 . . . Void A5 . . . Chalcogenide layer (grain-shaped "fcc" crystal)
A6 . . . Chalcogenide layer (columnar "fcc" crystal)
A11 . . . Interlayer dielectric film
A12 . . . Plug
A13 . . . Chalcogenide layer
A14 . . . Upper electrode
A15 . . . Hard mask
A16 . . . Interlayer dielectric film
A101 . . . Semiconductor substrate
A102 . . . Inter-element isolation oxidizing film
A103 . . . Gate oxide film
A104 . . . Gate electrode
A105 . . . Silicon nitride film
A106 . . . Diffusion layer
A107 . . . Silicon nitride film
A108 . . . Interlayer dielectric film
A109 . . . Tungsten plug
A110 . . . First electrical interconnect layer
A111 . . . Interlayer dielectric film
A112 . . . Tungsten plug
A113 . . . Chalcogenide layer
A114 . . . Upper electrode
A115 . . . Silicon oxide film
A116 . . . Interlayer dielectric film
A117 . . . Tungsten plug
A118 . . . Second electrical interconnect layer
B1 . . . Semiconductor substrate
B2 . . . p-well
B2a . . . n-well
B3, B3a, B3b . . . Element isolation trench
B4 . . . gate dielectric film
B5 . . . n-type polycrystal silicon film
B5a . . . p-type polycrystal silicon film
B6 . . . n-type polycrystal salicide film
B6a . . . p-type polycrystal salicide film
B7 . . . Sidewall spacer (silicon oxide film)
B8 . . . Sidewall spacer (silicon nitride film)
B9 . . . LDD active region of n-channel MISFET
B9a . . . LDD active region of p-channel MISFET
B10 . . . Active region of n-channel MISFET
B10a . . . Active region of p-channel MISFET
B11a, B11b, B11c, B11d . . . Silicon oxide films (interlayer dielectric films)
B12 . . . Barrier metal
B13 . . . Tungsten
B20 . . . High-resistance conductive material
B21 . . . Phase-change material anti-peeling film (dielectric film)
B22 . . . Phase change layer
B27 . . . Anneal-crystallized phase change layer
B23, B24, B26, B28 . . . Tungsten (metal film)
B25, B29 . . . Metal barrier
mmry . . . Memory cell formation region
lgc . . . Logic circuit formation region
DN . . . Active region of n-channel MISFET
DNP . . . Active region of n-channel MISFET
DP . . . Active region of p-channel MISFET
GM . . . Gate electrode of n-channel MISFET for memory cell selection
GN . . . Gate electrode of n-channel MISFET
GP . . . Gate electrode of p-channel MISFET
QM . . . n-channel MISFET for memory cell selection
QN . . . n-channel MISFET
QP . . . p-channel MISFET
TP . . . Memory cell lower contact electrode
BC . . . Bit line contact electrode
BL . . . Bit line
R . . . Resistive element
VM . . . Memory cell region via
VL . . . Logic circuit region via
M1 . . . First electrical interconnect
L . . . Element active region of MISFET
B31 . . . Phase change material
B35 . . . Objective lens for converging laser light
B35A . . . PBS
B35B . . . Collimator lens
B35C . . . Optical-axis direction
B36 . . . Laser head
B40 . . . Focus detector
B41 . . . Laser driving circuit
B42 . . . Focus control circuit
B43 . . . Microprocessor
B44 . . . X-Y table control circuit
B45 . . . Y-axis direction
B46 . . . Y-axis direction
B47 . . . High-output semiconductor laser
B48 . . . Signal processing circuit
B49 . . . Actuator
B50 . . . Silicon wafer
B56 . . . Crystallized section
B57 . . . Uncrystallized section
B58 . . . Laser spot width
B59 . . . Laser spot
B59A . . . Laser spot

What is claimed is:

1. A semiconductor device comprising:
   a semiconductor substrate;
   a select element on a main surface of the semiconductor substrate;
   an interlayer dielectric film provided over said select element;
   a plug provided so as to penetrate through said interlayer dielectric film, said plug being electrically connected to said select element; and
   a storage layer provided on an upper surface of said interlayer dielectric film and on an upper surface of said plug and able to store information via an atomic arrangement change, inclusive of a reversible phase change, between a crystal phase and an amorphous phase;
   wherein the storage layer is a chalcogenide layer of columnar chalcogenide crystal grains predominantly-oriented in a direction perpendicular to the main surface of the semiconductor substrate;
   wherein a crystal system of the columnar chalcogenide crystal grains is hexagonal.

2. The semiconductor device according to claim 1, wherein the chalcogenide layer is such that a number of the columnar chalcogenide crystal grains predominantly-oriented in a direction perpendicular to the main surface of the semiconductor substrate is at least four times a number of inclined crystal grains oriented in a direction oblique to the main surface of the semiconductor surface.

3. The semiconductor device according to claim 1, wherein the chalcogenide layer is such that a hexagonal (001) crystal face and crystal faces other than (001) are each oriented in a direction horizontal to the main surface of the semiconductor surface.

4. The semiconductor device according to claim 1, wherein the chalcogenide layer contains at least two elements selected from the group consisting of Ge, Sb, and Te.

5. The semiconductor device according to claim 1, wherein the chalcogenide layer contains at least two elements selected from the group consisting of Ge, Sb, and Te; and at least one element selected from the group consisting of a group-2b element, a group-1b element, an element of groups 3a to 7a, and a group-8 element in the periodic table.

6. The semiconductor device according to claim 1, wherein the chalcogenide layer has the columnar chalcogenide crystal grains predominantly-oriented in the direction perpendicular to the main surface of the semiconductor substrate existing in at least 80 percentage of all crystal grains in the chalcogenide layer.

7. A semiconductor device comprising:
a semiconductor substrate;
a select element on a main surface of the semiconductor substrate;
an interlayer dielectric film provided over said select element;
a plug provided so as to penetrate through said interlayer dielectric film, said plug being electrically connected to said select element; and
a storage layer provided on an upper surface of said interlayer dielectric film and on an upper surface of said plug and able to store information via an atomic arrangement change, inclusive of a reversible phase change, between a crystal phase and an amorphous phase;
wherein the storage layer is an unused original-manufacturer chalcogenide layer of columnar chalcogenide crystal grains predominantly-oriented in a direction perpendicular to the main surface of the semiconductor substrate, where the chalcogenide layer is unused in that such chalcogenide layer has not yet been recorded on by any user of the semiconductor device;
wherein a crystal system of the columnar chalcogenide crystal grains is hexagonal.

8. The semiconductor device according to claim 7, wherein the chalcogenide layer is such that a number of the columnar chalcogenide crystal grains predominantly-oriented in a direction perpendicular to the main surface of the semiconductor substrate is at least four times a number of inclined crystal grains oriented in a direction oblique to the main surface of the semiconductor surface.

9. The semiconductor device according to claim 7, wherein the chalcogenide layer has the columnar chalcogenide crystal grains predominantly-oriented in the direction perpendicular to the main surface of the semiconductor substrate existing in at least 80 percentage of all crystal grains in the chalcogenide layer.

10. The semiconductor device according to claim 7, wherein the chalcogenide layer is such that a hexagonal (001) crystal face and crystal faces other than (001) are each oriented in a direction horizontal to the main surface of the semiconductor surface.

11. The semiconductor device according to claim 7, wherein the chalcogenide layer contains at least two elements selected from the group consisting of Ge, Sb, and Te.

12. The semiconductor device according to claim 7, wherein the chalcogenide layer contains at least two elements selected from the group consisting of Ge, Sb, and Te; and at least one element selected from the group consisting of a group-2b element, a group-1b element, an element of groups 3a to 7a, and a group-8 element in the periodic table.

13. A semiconductor device comprising:
a semiconductor substrate;
a select element on a main surface of the semiconductor substrate; an interlayer dielectric film provided over said select element;
a plug provided so as to penetrate through said interlayer dielectric film, said plug being electrically connected to said select element; and
a storage layer provided on an upper surface of said interlayer dielectric film and on an upper surface of said plug and able to store information via an atomic arrangement change, inclusive of a reversible phase change, between a crystal phase and an amorphous phase;
wherein the storage layer is a chalcogenide layer in existence before any user recording operation to record information in the chalcogenide layer, of columnar chalcogenide crystal grains predominantly-oriented in a direction perpendicular to the main surface of the semiconductor substrate;
wherein a crystal system of the columnar chalcogenide crystal grains is hexagonal.

14. The semiconductor device according to claim 13, wherein the chalcogenide layer is such that a number of the columnar chalcogenide crystal grains predominantly-oriented in a direction perpendicular to the main surface of the semiconductor substrate is at least four times a number of inclined crystal grains oriented in a direction oblique to the main surface of the semiconductor surface.

15. The semiconductor device according to claim 13, wherein the chalcogenide layer has the columnar chalcogenide crystal grains predominantly-oriented in the direction perpendicular to the main surface of the semiconductor substrate existing in at least 80 percentage of all crystal grains in the chalcogenide layer.

16. The semiconductor device according to claim 13, wherein the chalcogenide layer is such that a hexagonal (001) crystal face and crystal faces other than (001) are each oriented in a direction horizontal to the main surface of the semiconductor surface.

17. The semiconductor device according to claim 13, wherein the chalcogenide layer contains at least two elements selected from the group consisting of Ge, Sb, and Te.

18. The semiconductor device according to claim 13, wherein the chalcogenide layer contains at least two elements selected from the group consisting of Ge, Sb, and Te; and at least one element selected from the group consisting of a group-2b element, a group-1b element, an element of groups 3a to 7a, and a group-8 element in the periodic table.

19. A semiconductor device comprising:
a semiconductor substrate;
a select element on a main surface of the semiconductor substrate;
an interlayer dielectric film provided over said select element;
a plug provided so as to penetrate through said interlayer dielectric film, said plug being electrically connected to said select element; and
a storage layer provided on an upper surface of said interlayer dielectric film and on an upper surface of said plug and able to store information via an atomic arrangement change, inclusive of a reversible phase change, between a crystal phase and an amorphous phase;
wherein the storage layer is a chalcogenide layer of columnar chalcogenide crystal grains, wherein a majority of the columnar chalcogenide crystal grains are oriented in a direction perpendicular to the main surface of the semiconductor substrate;
wherein a crystal system of the columnar chalcogenide crystal grains is hexagonal.

* * * * *